United States Patent [19]
Lesmeister

[11] Patent Number: 5,931,953
[45] Date of Patent: Aug. 3, 1999

[54] PARALLEL PROCESSING INTEGRATED CIRCUIT TESTER

[75] Inventor: Gary J. Lesmeister, Hayward, Calif.

[73] Assignee: Credence Systems Corporation, Fremont, Calif.

[21] Appl. No.: 09/007,128

[22] Filed: Jan. 14, 1998

Related U.S. Application Data

[62] Division of application No. 08/534,015, Sep. 25, 1995, Pat. No. 5,748,642.

[51] Int. Cl.$^6$ .......................................... G06F 1/04
[52] U.S. Cl. ............................ 713/500; 713/502; 714/25; 709/238
[58] Field of Search ................................ 395/183.01, 555, 395/557, 559, 800.1, 200.68, 551, 552; 371/22.1, 27; 702/124, 125; 714/724, 25; 713/400, 401, 500, 503, 600

[56] References Cited

U.S. PATENT DOCUMENTS

| 5,032,783 | 7/1991 | Hwang et al. | 324/73.1 |
| 5,381,421 | 1/1995 | Dickol et al. | 371/27 |
| 5,696,772 | 12/1997 | Lesmeister | 371/27 |

OTHER PUBLICATIONS

Philip N. King, "Flexible, High–Performance Pin Electronics Implementation", 1989 International Test Conference, pp. 787–794.

Kikuchi et al., "A 250MHz Shared–Resource VLSI Test System With High Pin Count And Memory Test Capability", 1989 International Test Conference, pp. 558–566.

*Primary Examiner*—Dennis M. Butler
*Attorney, Agent, or Firm*—Smith-Hill and Bedell

[57] ABSTRACT

An integrated circuit tester includes several processing nodes, one node associated with each terminal of an integrated circuit device under test (DUT). At precisely determined times, each node generates and transmits a test signal to the associated DUT terminal or samples a DUT output signal produced at the DUT terminal. Each node includes memory for storing algorithmic instructions for generating a set of commands indicating when a test signal is to be transmitted to the associated terminal and indicating when a DUT output at the associated node is to be sampled. Each node also includes a processor for processing the algorithmic instructions to produce the commands. Each node further includes circuits responsive to the commands for transmitting the test signals to the associated DUT terminal and for sampling the DUT output signal produced at the associated DUT terminal at times indicated by the commands. The processing nodes are interconnected in serial fashion to form a network for conveying the algorithmic instructions to the memory of each node and for conveying signals for synchronizing operations of the processing nodes. The nodes contain circuitry to start and stop operations in a unified manner so that the serially connected nodes act as if connected in parallel.

11 Claims, 19 Drawing Sheets

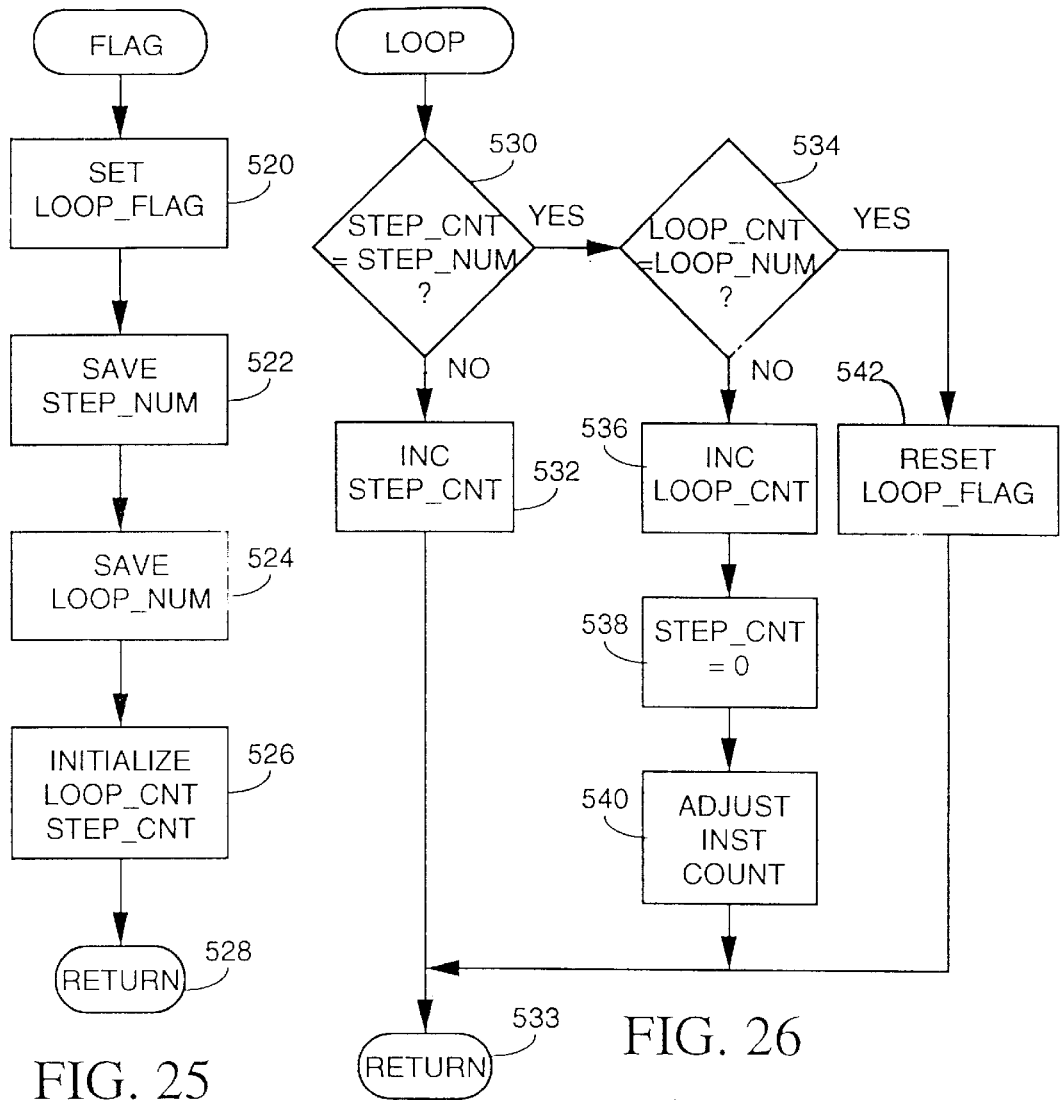
FIG. 25
FIG. 26
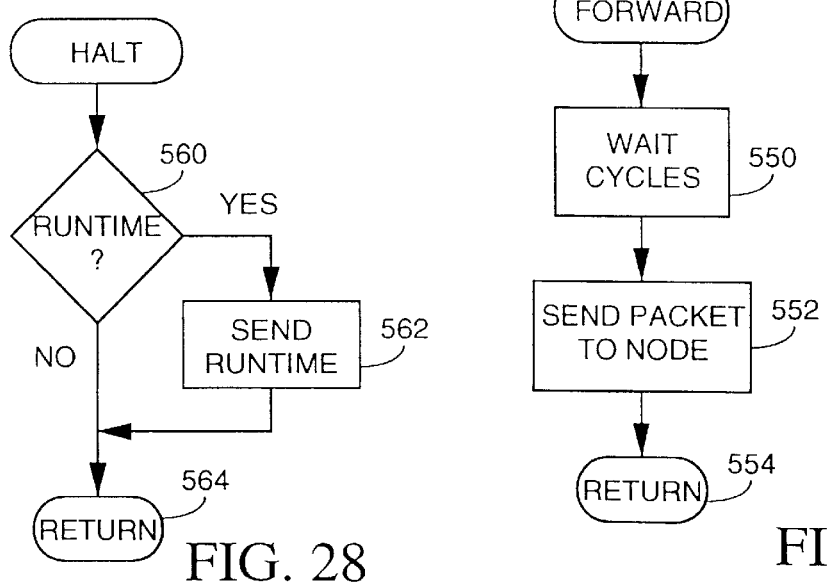
FIG. 28
FIG. 27

PARALLEL PROCESSING INTEGRATED CIRCUIT TESTER

CROSS REFERENCE TO RELATED APPLICATIONS

This is a divisional application of U.S. patent application Ser. No. 08/534,015 filed Sep. 25, 1995 for PARALLEL PROCESSING INTEGRATED CIRCUIT TESTER, now U.S. Pat. No. 5,748,642.

BACKGROUND OF THE INVENTION

1. Field of the Invention

The present invention relates in general to integrated circuit test equipment and in particular to an integrated circuit tester employing parallel processing of algorithmic instructions for controlling test signal generation and data acquisition during an integrated circuit test.

2. Description of Related Art

To test an integrated circuit or similar device under test (DUT), a typical integrated circuit tester transmits test signal pulses to various terminals of the DUT and acquires output data generated at those terminals by the DUT in response to the test signals. The acquired data may then be analyzed to determine whether the DUT is responding as expected to the test signals. Generally the transmission of test signals and the acquisition of DUT output data must be precisely coordinated.

Integrated circuit testers typically include a set of modules or "nodes", one node being associated with each terminal of the DUT. A test is organized into a set of successive time segment ("test cycles"). During any given test cycle, each node can either transmit a test signal to the associated terminal, acquire DUT output data at the associated terminal, or do neither. Each node includes its own memory for storing a sequence of commands. Each command indicates an action to be taken by the node during a test cycle—e.g. whether it is to start or stop transmitting, start or stop acquiring. Each command also indicates a time during the cycle the action is to be taken. Each node also includes circuits for sequentially reading the commands out of memory during successive test cycles and performing the indicated actions.

The nodes are typically interconnected to a host computer via a bus network. Before a test begins, the host computer executes an algorithm for generating the commands to be stored in the node memories. The host computer then transmits the generated commands to the nodes for storage in their memories. Thereafter a clock signal transmitted to all of the nodes synchronizes the nodes so that they all read the commands out of memory and perform the indicated actions in unison.

Generally a tester stores one command in each node memory for each test cycle. In recent years the size and complexity of integrated circuits have increased dramatically and so too has the length of the command sequences needed to fully test these circuits. It is not unusual for tests to run many millions of cycles and therefore require command sequences having many millions of elements. Storage requirements for such large command sequences exceed the size of memory that can be practically or economically installed at each node. Thus long tests are performed in segments with tester operation suspended between each segment while the commands for the next segment are loaded into the node memories. This greatly extends the total time and costs required for a test.

As DUT operating speeds have increased so to has the need for precise and flexible control over the timing of test signal transmission and DUT output signal sampling during each test cycle. A prior art tester includes a time formatting circuit capable of producing an output reference signal at a selected time during a test cycle. The time is selected in accordance with an input "time word"—data conveying a number indicating a particular time during a test cycle. In order to resolve time into small increments (e.g. 1/1,000,000 of a test cycle), the time word must be very long (e.g. 20 bits). For long tests, it would take too much memory to include a long time word in each command for each test cycle. Thus before the start of a test a few (e.g. four) pre-selected time words are stored in registers within each node. The four time words indicate four different times within a test cycle that an event may occur. The commands in each node thus need include only 2 bits to indicate event timing. However in such a tester system, while event timing can be accurately controlled, timing selection is limited. Such a tester cannot, for example, perform a test wherein signal timing is incrementally shifted by small amounts to determine the tolerance of a circuit for variation in signal timing without periodically stopping the test and loading new time words into the node registers.

What is needed is an integrated circuit tester which can perform a long, high speed integrated circuit test with great flexibility in timing selection but without need for large node memories.

SUMMARY OF THE INVENTION

In accordance with one aspect of the invention, an integrated circuit tester transmits test signals to selected terminals of a device under test (DUT) and acquires data produced by the DUT at others of its terminals during a succession of test cycles. The tester includes several processing nodes, one node associated with each terminal of the DUT. Each node includes a memory for storing algorithmic instructions for generating a sequence of commands. Each successive command includes data indicating an action to be taken during a next successive test cycle, such as asserting or deasserting the test signal or beginning or ending acquisition of DUT output data. Each command also includes timing data indicating a time during the next test cycle when the action is to be taken. Each node also includes a circuits for processing the algorithmic instructions to produce the commands and circuits responsive to the commands for controlling the test signal and data acquisition as indicated by the commands. For tests involving long sequences of commands, the amount of memory needed to store algorithmic instructions for generating the command sequences is much smaller than the amount of memory needed to store the command sequences themselves.

The circuits processing each command includes a time formatter producing reference signals for initiating the selected actions at a precisely selectable times during the test cycles. In accordance with another aspect of the invention, reference signal timing is fully determined by a "time word" included in each generated command, rather than by a reference in each command to one of a few time words that have been pre-loaded into the time formatter. Thus in the present invention, the timing of events during successive test cycles is fully and independently selectable within the full range and resolution of the time formatter and is not limited to a few selected times.

It is accordingly an object of the invention to provide an integrated circuit tester which performs a long integrated circuit test without need for large node memories and without having to periodically halt the test to reload the node memories.

It is another object of the invention to provide an integrated circuit tester which can provide for highly flexible and accurate timing of testing events during each cycle of a test.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 5A is a representation of a data word processed by the time formatter of FIG. 2;

FIGS. 18–28 are flow charts illustrating algorithms executed by the tester of FIG. 1.

DESCRIPTION OF THE PREFERRED EMBODIMENT(S)

Figure 1:
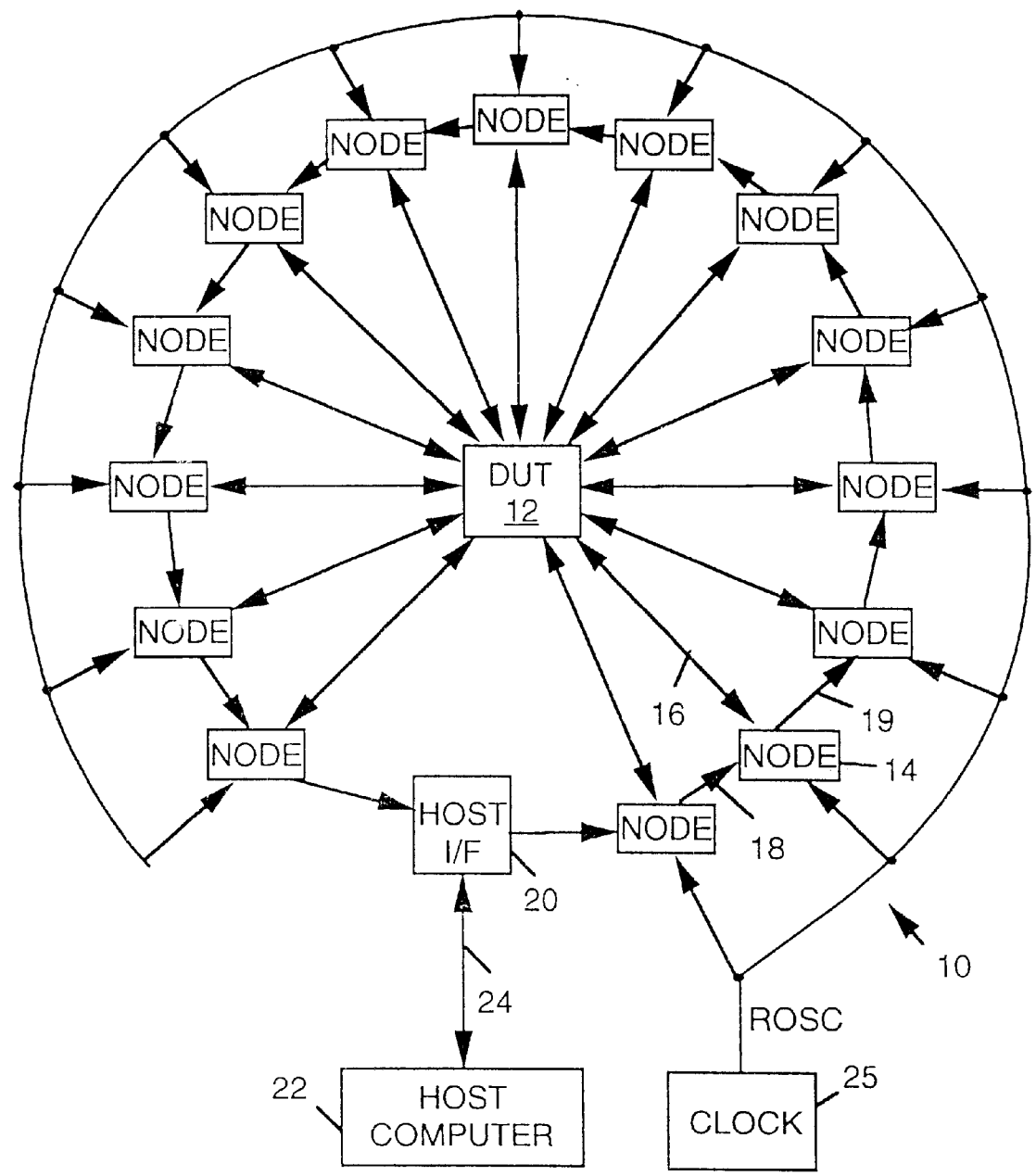
FIG. 1 is a block diagram of a parallel processing integrated circuit tester in accordance with the present invention.

FIG. 1 is a block diagram of a tester 10 in accordance with the present invention for testing an integrated circuit or other device under test (DUT) 12. DUT 12 has a set of pins, pads or other type of access terminals for input and output signals. Tester 10 includes several processing nodes 14. For simplicity FIG. 1 shows only a few nodes 14 but the tester 10 may include a much larger quantity of nodes 14. Each node 14 may be linked by a separate conductor 16 to a separate terminal of DUT 12. During a test, each node 14 may transmit a test signal to the node vie conductor 16 or may sample output signals produced by the DUT on conductor 16.

A test is partitioned into a number of test cycles of similar duration, and at precisely determined times during each of a succession of test cycles each node 14 may carry out one or more actions in response to a sequence of commands. Each successive command indicates an action to be taken during a successive test cycle, such as asserting a test signal or sampling the DUT output signal. Each command also indicates a relative time during the test cycle that the action is to be taken.

Instead of storing the sequence of commands, each node 14 stores algorithmic instructions for generating the sequence of commands. Each node 14 includes circuits for processing the algorithmic instructions to produce the command sequence, wherein each command is generated immediately before it is needed during the test. Each command is a data word and it is well-known that a relatively small instruction set may employ mathematical operations such as addition, subtraction, bit-shifting and algorithmic operations such as branching and repetition to generate a much larger data sequence. For long test operations requiring many commands, the memory required to store an algorithmic instruction set for generating the necessary commands is much smaller than the memory required to store the commands themselves.

Accordingly, the nodes of the tester of the present invention receive as input algorithmic instructions for generating the commands rather than the commands themselves. The processing nodes 14 are interconnected in a loop by transmission lines 18, 19 operating as network interface to form a loop network for conveying the algorithmic instructions, as well as control data and signals to each node. A host interface circuit 20, interconnected in the network in place of a node, provides a host computer 22 with access to the network via a bus 24. A reference oscillator clock signal ROSC produced by a clock circuit 25 of FIG. 1 provides a common timing reference to all nodes 14 so that their operations may be synchronized during a test operation in a manner described below.

Before a test operation begins, the host computer 22 transmits a separate set of algorithmic instructions to each node 14. The host computer 22 also transmits control data to each node 14 via the network. The control data, stored in registers within each node 14, selects various modes of operation of the node, such as for example the voltage level of test signals transmitted to the DUT 12 or the duration of a test cycle. To commence a test operation, host computer 22 transmits a START control signal to the nodes 14 via the network. Each node 14 includes its own internal instruction processor which, in response to the START signal, begins reading and processing the algorithmic instructions in the node's memory to produce a sequence of commands. Each command indicates an action to be taken during a next test cycle and a particular time during the next test cycle the node is to take the indicated action. Each node 14 includes an internal "time-formatter" circuit for decoding the commands. At the time indicated by each command the time formatter signals an internal DUT interface circuit to take the action indicated by the command.

Figure 2:
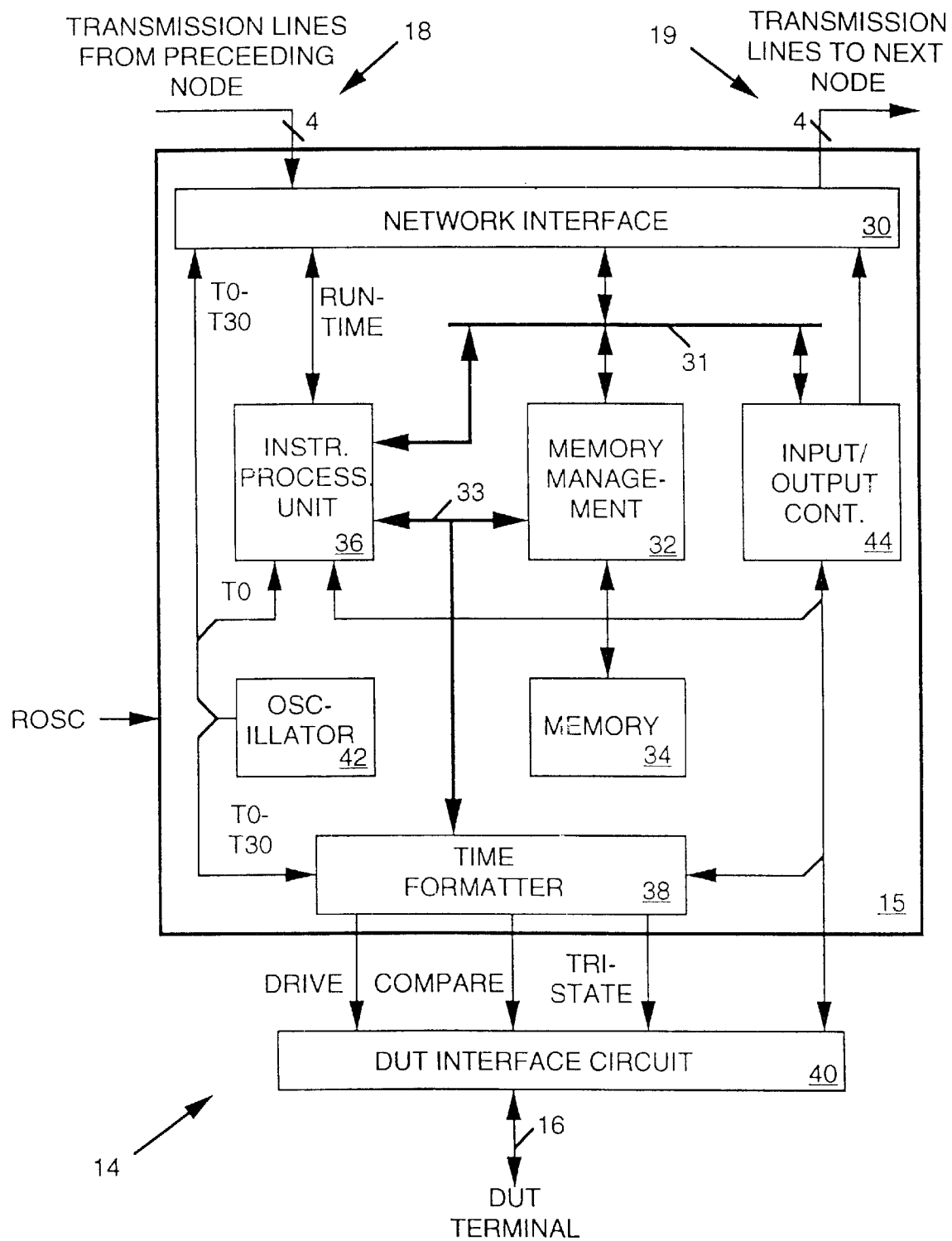
FIG. 2 is a block diagram of a typical node of the integrated circuit tester of FIG. 1.

FIG. 2 is a block diagram of a typical node 14 of tester 10 of FIG. 1. Node 14 includes network interface 30 for interfacing the node to the unidirectional incoming and outgoing serial transmission lines 18 and 19 linking the node to preceding and next nodes of the network loop. In the preferred embodiment of the invention four incoming transmission lines 18 and four outgoing transmission lines 19 link each node to its nearest neighbors.

Node 14 also includes a memory management unit 32, an instruction memory 34 and an instruction processing unit 36. The instruction memory 34 is suitably a conventional addressable random access memory (RAM) for storing algorithmic instructions. Processing unit 36 executes the instructions stored in memory 34 to produce a sequence of commands controlling node operations. The memory management unit 32 is a conventional RAM controller for controlling read and write access to memory 34. Each network interface 30 receives serial data and addresses via an incoming transmission line 18 and forwards them to a next node of the network loop via an outgoing transmission line 19. Each network interface 30 may also convert the serial data and address words to a parallel form and forward them to a local bus 31. Memory management unit 32 determines whether memory 34 is being addressed and if so stores the data in memory 34. During a test operation, processing unit 36 transmits memory addresses to memory management unit 32 via 24-bit bus 33 and the memory management unit reads instructions out of memory 34 at those addresses and forwards the instructions to processing unit 36 via local bus 31.

Node 14 additionally includes a time formatter circuit 38 and a device under test (DUT) interface circuit 40. DUT interface circuit 40 includes an input/output port connected to the device under test via conductor 16. During each test cycle DUT interface circuit 40 may transmit a test signal to the DUT via conductor 16 and/or may sample and store a data bit generated on conductor 16 by the DUT. As processing unit 36 executes the instructions read out of memory 34 it generates and transmits commands to the time formatter 38 via bus 33. In response to each command, time formatter 38 selectively asserts or de-asserts one of three output signals, COMPARE, DRIVE, and TRISTATE at an appropriate time. The time formatter 38 asserts or de-asserts the TRISTATE signal to tell the DUT interface circuit 40 when to drive conductor 16 with a test signal. The DRIVE signal is asserted and de-asserted to tell the DUT interface circuit 40 when the test signal is to be high or low. The COMPARE signal is asserted and de-asserted to tell the DUT interface circuit 40 when to begin or end sampling a signal generated by the DUT. An input/output (I/O) controller 44 tied to local bus 31 communicates with other nodes in the network or with the host computer 22 of FIG. 1 via network interface 30 and transmission lines 18, 19. Before the start of test operation, I/O controller 44 receives control data via the network and stores that data in various registers within network interface 30, instruction processing unit 36, time formatter 38 and DUT interface circuit 40. The control data sets various modes of operation of these devices during a test as discussed herein below. After a test is completed, I/O controller 44 enables the host computer or other device to read test data out of an acquisition memory within DUT interface circuit 40.

Node 14 also includes connections between network interface 30 and processing unit 36 for conveying incoming and outgoing RUNTIME control signals. These RUNTIME signals may be transmitted through selected transmission lines 18, 19 to signal the start and end of test operations. The RUNTIME signals may also provide communication between nodes during test operations, for example to indicate changes in mode of operation or errors that occur during a test.

An oscillator circuit 42 included in each node 14 helps to synchronize the operations of all of the nodes of the network during a test operation. Oscillator circuit 42 produces a set of timing signals T0–T30 transmitted to time formatter 38 and network interface 30. These timing signals T0–T30 have the same frequency as the ROSC signal but are time shifted one from another to divide the period of the ROSC signal into 31 segments of substantially equal duration. In each node 14, the T0 timing signal clocks instruction processing by the instruction processing unit 36. In response to commands, the time formatter 38 selects one timing signal from among the timing signals T0–T30 as a reference for timing the action indicated by the command. Since the T0–T30 signals of all nodes are maintained in the same phase relationship to the ROSC signal, the T0–T30 signals of each node are in phase with similar signals in every other node. Since instruction processing and event timing in each node are referenced to the T0–T30 signals, the activities of all nodes can be synchronized.

The ROSC signal, and therefore the T0 signal, is suitably set to the speed of operation of a microprocessor within processing unit 36. It is desirable, however, that timing of the COMPARE, DRIVE and TRISTATE signals be controllable with higher resolution. The T0–T30 signals resolve time to 1/31st of a ROSC cycle, but as discussed herein below, time formatter 38 includes circuitry which can further resolve its output signal timing by a factor of 16. Assuming a 100 Mhz ROSC signal, suitable for 0.8 micron technology, node 14 can resolve COMPARE, DRIVE and TRISTATE signal timing edges to about 20 psec. Using 0.4 micron technology, a 200 MHz ROSC signal will permit 10 psec resolution.

Devices 30, 32, 34, 36, 38, 42 and 44 are suitably implemented on a single large scale integrated circuit 15 using CMOS logic technology.

Figure 3:
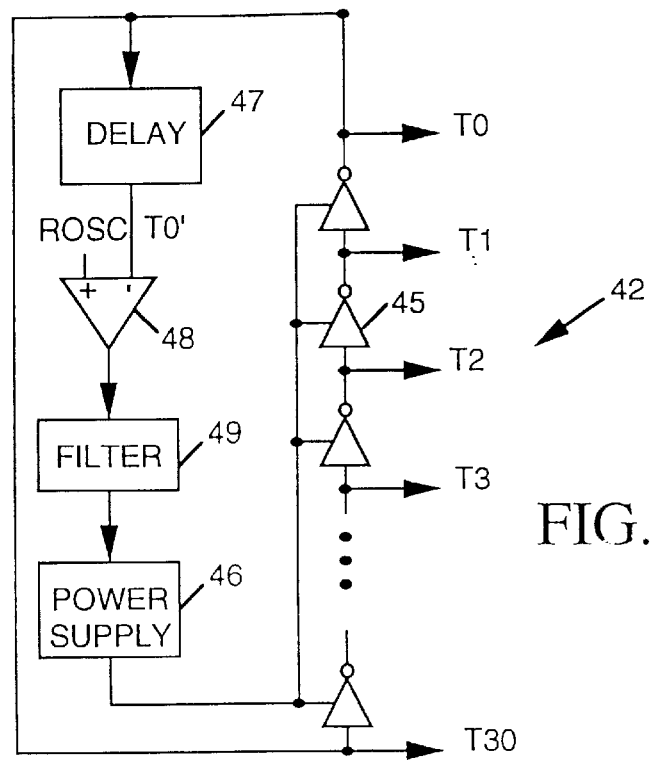
FIG. 3 is a block diagram depicting the phase locked oscillator of FIG. 2.

FIG. 3 is a block diagram depicting the phase locked oscillator 42 of FIG. 2 used to help synchronize operations of all the nodes 14 of the tester of FIG. 1. Oscillator 42 includes a set of 31 identical inverters 45 connected in series to form a loop. A signal pulse circulates around the loop at a rate determined by the propagation delay time of inverters 45. This delay time is controlled by the output voltage of a power supply 46 supplying power to all inverters 45. The timing signals T0–T30 are taken at the connections between inverters 45. Since the propagation delay of all inverters 45 are substantially the same, signals T0–T30 are all phase shifted one from one another by substantially equal amounts. The T0 signal, delayed by a delay circuit 47 is supplied as signal T0' to one input of a comparator 48. The ROSC signal is supplied to another input of the comparator. Whenever a ROSC signal pulse precedes a T0' pulse, the output of comparator 48 goes high. When a T0' pulse precedes a ROSC signal pulse, the output of comparator 48 goes low. The output of comparator 48 is filtered by a filter 49 and supplied to power supply 46. The voltage of the output of filter 49 controls the power supply 46 output voltage.

It should be understood, that in alternative embodiments elements 45 may be devices other than inverters such as, for example, current starved buffers or differential elements.

The feedback provided by devices 46–49 phase locks the T0' signal to the ROSC signal to ensure that the T0–T30 signals have the same frequency as the ROSC signal with each having a slightly different phase. Since the T0–T30 signals are phase shifted one from another by equal amounts, the time between successive T0–T30 is equal to 1/31st of the period of the ROSC signal.

In order for the system of FIG. 1 to properly test a DUT 12, those nodes 14 transmitting test signals to the DUT and those nodes 14 acquiring sample data from signals produced by the DUT must do so at precise times relative to one another. The ROSC signal sent to all nodes 14 provides a reference for synchronizing their respective timing signals T0–T30. For example, if two nodes each transmitted a test signal pulse to the DUT when they each detected a pulse of the T5 signal, then the two test signals would be transmitted to the DUT at the same time since the two T5 signals, presumably phase shifted from the ROSC signal by the same amount, would be in phase with one another. However, the two test signals would not necessarily be in phase for two reasons.

First the times two nodes 14 require to generate their test signals upon detection of their T5 signal pulses may differ. This happens when the signal processing speeds of the two nodes differ. The two nodes are implemented on different integrated circuits and variations in chip fabrication parameters can affect processing speed. Also the two nodes, being physically separate, may operate in different ambient temperatures, and chip temperature affects processing speed. To help solve this problem, the delay circuit 47 is included in the feedback loop of oscillator 42 of FIG. 3. Delay circuit 47 phase shifts the T0–T30 signals forward in time by an amount that accounts for the processing delay of time formatter 38 of FIG. 2. Delay circuit 47 is simply a series of gates having the same channel width (and therefore delay) as the gates that process the T0–T30 signals to control the COMPARE, DRIVE and TRISTATE signals. Since oscillator 42 and time formatter 38 are implemented on the same integrated circuit 15, any process or environmental changes affecting the signal propagation speed through the time formatter 38 of FIG. 2 will affect the delay of the delay circuit 47 of FIG. 3. The delay circuit 47 of each node therefore automatically adjusts its own delay to phase shift the signals T0–T30 by appropriate amounts to account for the differences in propagation delay through the node's time formatter. Thus, for example, a T5 pulse of a slow node occurs before the T5 pulse of a faster node so that COMPARE, DRIVE or TRISTATE signals asserted by both nodes in response to the T5 pulse are in fact asserted at the same time.

A second timing problem arises because the ROSC signal may not arrive at all nodes 14 of FIG. 1 at the same time. The nodes are physically separate and the ROSC clock 25 of FIG. 1 is more distant from some nodes than others. Therefore, even though the timing signal T5 pulses of the two nodes are phase shifted from ROSC signal pulse by the same amount they would not themselves be in phase. Therefore test signals timed according to differing timing signal T5 pulses would not be concurrent. The present invention overcomes this problem by providing for calibration of delay circuits within the time formatter 38 within each node, allowing small adjustments in delay to account for difference is ROSC signal arrival time. Such calibration is discussed herein below in connection with details of the time formatter.

Figure 4:
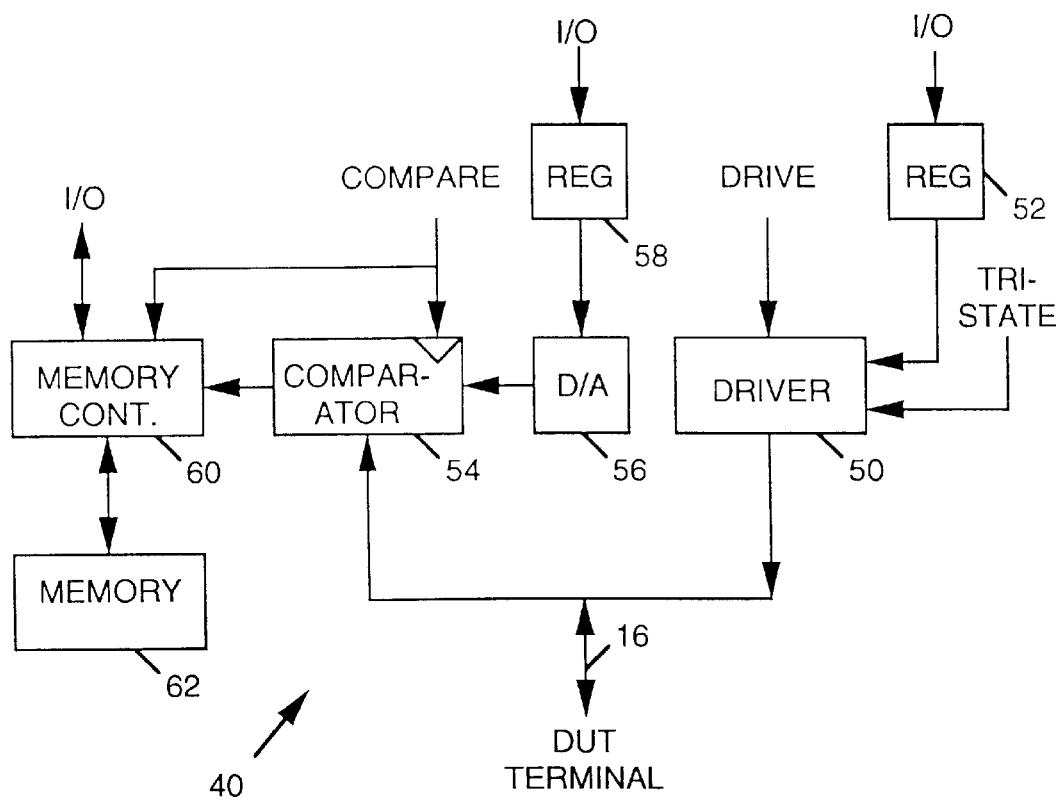
FIG. 4 is a block diagram of the device under test interface circuit of FIG. 2.

FIG. 4 is a block diagram of DUT interface circuit 40 of FIG. 2. Circuit 40 includes a conventional tristate driver circuit 50 for supplying the test signal transmitted to the DUT via conductor 16. Driver circuit 50 receives the DRIVE and TRISTATE signals from the time formatter 38 of FIG. 2. The TRISTATE signal determines whether the driver transmits is test signal output to the DUT via conductor 16. The DRIVE input signal controls the logical state of the test signal output. Driver 50 is programmable in the sense that the logic levels of its test signal output can be adjusted depending on the requirements of the DUT. A register 52 stores control data transmitted thereto from the host computer via the I/O controller 44 of FIG. 2 prior to a test operation. The data in register 52 is supplied to driver 50 controls test signal logic levels.

DUT interface circuit 40 also includes a comparator 54. Comparator 54 compares a signal generated by the DUT on conductor 16 with an analog signal output of a digital-to-analog (D/A) converter 56. The magnitude of the D/A converter 56 output signal is controlled by data stored in a register 58 indicating a breakpoint between logical true and logical false state of the DUT output signal. The host computer loads data into register 58 via the I/O controller prior to the start of a test operation. When the COMPARE signal from the time formatter 38 of FIG. 2 is asserted, comparator 54 produces an output data bit indicating whether the voltage of the DUT output signal is higher than the D/A converter 56 output signal. When the COMPARE signal is next de-asserted, a memory controller circuit 60 stores the bit in an acquisition memory 62. During a test operation, acquisition memory 62 may thus acquire and store a sequence of data values. Thereafter the host computer, operating through I/O controller 44 of FIG. 2, may sequentially read the acquired data out of memory 62 via memory controller 60 for subsequent analysis.

Figure 5:
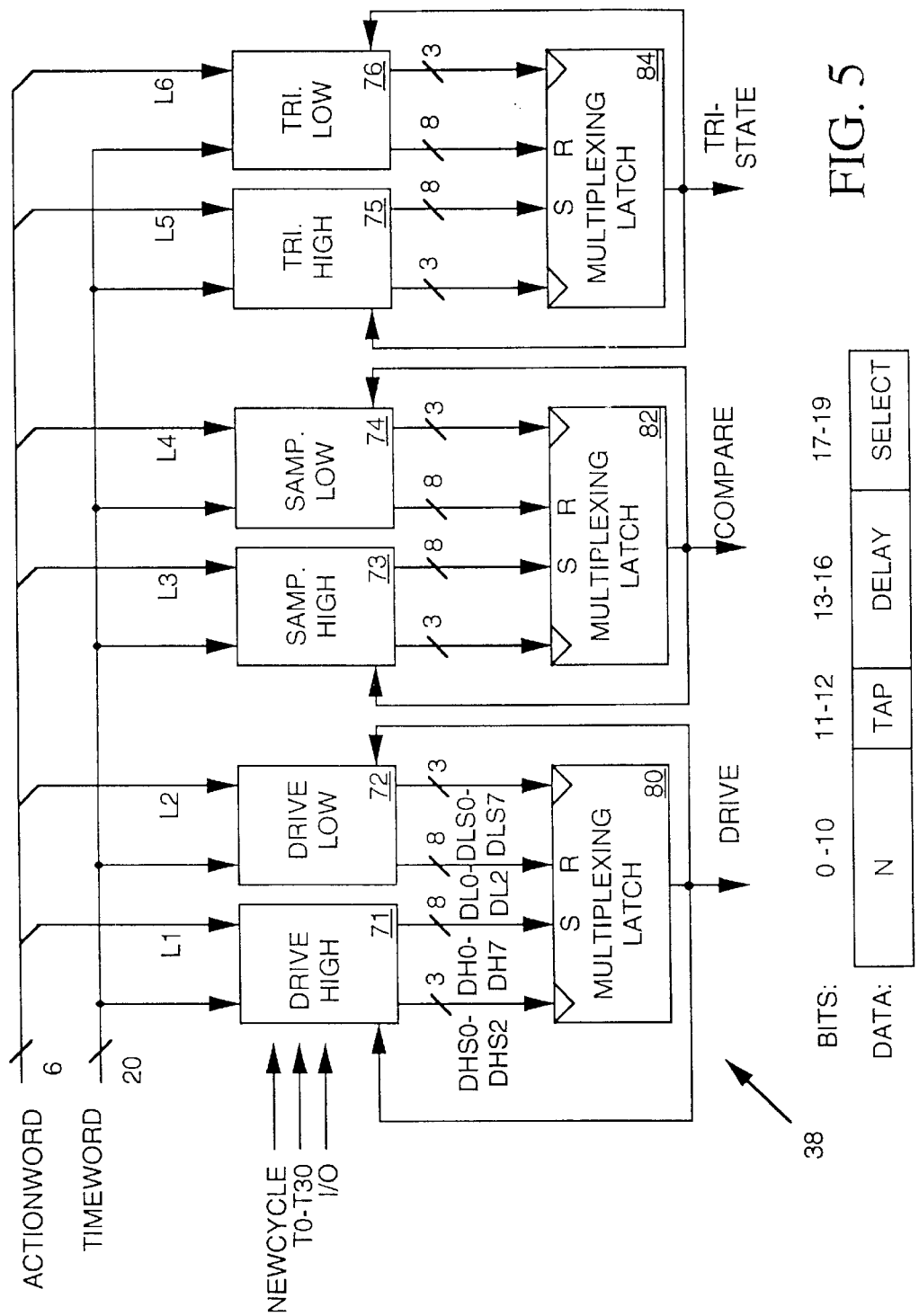
FIG. 5 is a block diagram depicting the time formatter of FIG. 2.

FIG. 5 is a block diagram depicting the time formatter 38 of FIG. 2. Time formatter 38 includes a set of six timing circuits 71–76 and a set of multiplexing latches 80, 82 and 84. Drive high circuit 71 determines when the DRIVE signal is driven high, drive low circuit 72 determines when the DRIVE signal is driven low. Sample high circuit 73 and sample low circuit 74 determine when the COMPARE signal is driven high and low, respectively, and tristate high circuit 75 and tristate low circuit 76 determine when the TRISTATE signal is driven high or low.

Circuits 71–76 can operate in either of two modes, a PROCESSOR mode or a PATTERN mode. They need not all operate in the same mode at any given time. A test operation is segmented into a set of successive test cycles, each spanning a selected number of cycles of the T0 timing signal. In the PROCESSOR MODE, the instruction processing unit 36 of FIG. 2 transmits one or more commands to the time formatter 38 during each test cycle. Each command includes a 20-bit TIMEWORD and a 6-bit ACTIONWORD. The TIMEWORD indicates a particular time at which time formatter is to carry out an action during the next cycle and the ACTION word indicates the particular action to be taken. The TIMEWORD is sent in parallel to each circuit 71–76 the PROCESSOR mode while each bit L1–L6 of the ACTION-WORD is sent to a corresponding circuit 71–76, respectively. If an ACTIONWORD bit is set, the circuit 71–76 that receives it stores the TIMEWORD and initiates an action during the next test cycle at the time indicated by the TIMEWORD. Thus the ACTIONWORD selects an action to be taken during the next test cycle by selecting the particular timing circuit 71–76 to receive the TIMEWORD.

In the PATTERN mode, each timing circuit 71–76 bases its timing determination on sequences of TIMEWORDs that the host computer 22 of FIG. 1 loads into the timing circuit 71–76 via the I/O controller 44 of FIG. 2 before the testing process starts. When, for example, the DRIVE signal is to be asserted and de-asserted in a short repetitive pattern during a test operation, the two circuits 71 and 72 which control the timing of the DRIVE signal may be operated in the PATTERN mode. When the DRIVE signal is to be asserted and de-asserted in a long pattern, the PROCESSOR mode is selected. The modes of operation for circuits 73–76 are selected in a similar fashion.

FIG. 5A is a representation of a TIMEWORD processed by time formatter 38. Referring to FIGS. 5 and 5A, in the PROCESSOR mode when a TIMEWORD is stored in any one of circuits 71–76 during a test cycle, then that circuit initiates a particular action during the next test cycle at a time indicated by the TIMEWORD. At the beginning of that next test cycle the processing unit sends a NEWCYCLE pulse to each timing circuit 71–76. If, for example, drive high circuit 71 is operating in the PROCESSOR mode, it responds to the NEWCYCLE pulse by counting T0 signal cycles up to the number N indicated by the first 11 bits (bits 0–10) of its last stored TIMEWORD as illustrated in FIG. 5A. The drive high circuit 71 then selects a particular subgroup DH0–DH7 of eight of the 31 T0–T30 timing signals, delays them by a selected amount, and passes them on to a "set" input of multiplexing latch 80 as its output signals DH0–DH7. Bits 11 and 12 (TAP) of the TIMEWORD, as shown in FIG. 5A, indicate which particular subgroup (DH0–DH7) of eight of the 31 timing signals T0–T30 are selected. Bits 13–16 (DELAY) indicate the amount by which those eight timing signals are delayed. In the meantime, the drive high circuit 71 also forwards the last 3 bits (SELECT) of the TIMEWORD as selection signals DHS0–DHS2 to a "set selection" input of the multiplexing latch 80. In response to the DHS0–DHS2 bits, multiplexing latch 80 selects one of the eight selected timing signals DH0–DH7. When that one timing signal delivers a pulse to the set input of multiplexing latch 80, the latch sets (drives high) its output signal DRIVE.

Thus a TIMEWORD, when loaded into drive high circuit 71, precisely indicates when the DRIVE signal is to be driven high during the next test cycle. In a similar manner, when the drive low circuit 72 receives a TIMEWORD in response to the L2 control signal it thereafter transmits 8 separate timing signals DL0–DL7 to reset inputs of multiplexing latch 80 along with 3 control bits DLS0–DLS2 for selecting one of the 8 timing signals. Latch 80 then resets (drives low) the DRIVE signal in response to a pulse from the selected timing signal DL0–DL7. Thus a TIMEWORD, when loaded into drive low circuit 72 very precisely indicates when, with respect to the next assertion of the NEWCYCLE signal, the DRIVE signal is to be driven low.

Multiplexing latch 82 produces the COMPARE signal in response to signals from sample high circuit 72 and sample low circuit 73 and multiplexing latch 84 produces the TRISTATE signal in response to signals from tristate high circuit 75 and sample low circuit 76. These circuits operate in a manner similar to circuits 71, 72 and 80 to control the states of the COMPARE and TRISTATE signals.

For those circuits 71–76 that are to operate in the PATTERN mode, the host computer 22 of FIG. 1, acting through I/O control circuit 44 of FIG. 2, preloads a set of up to four TIMEWORDS into each timing circuit 71–76 before a test operation begins. As in the PROCESSOR mode the TIMEWORDS also indicate times during successive test cycles during which an action is to occur. However, during the test operation, those circuits 71–76 that are to operate in the PATTERN mode repetitively execute the operations indicated by their stored TIMEWORD sequences during successive test cycles and do not receive TIMEWORDS from the instruction processing unit.

Figure 6:
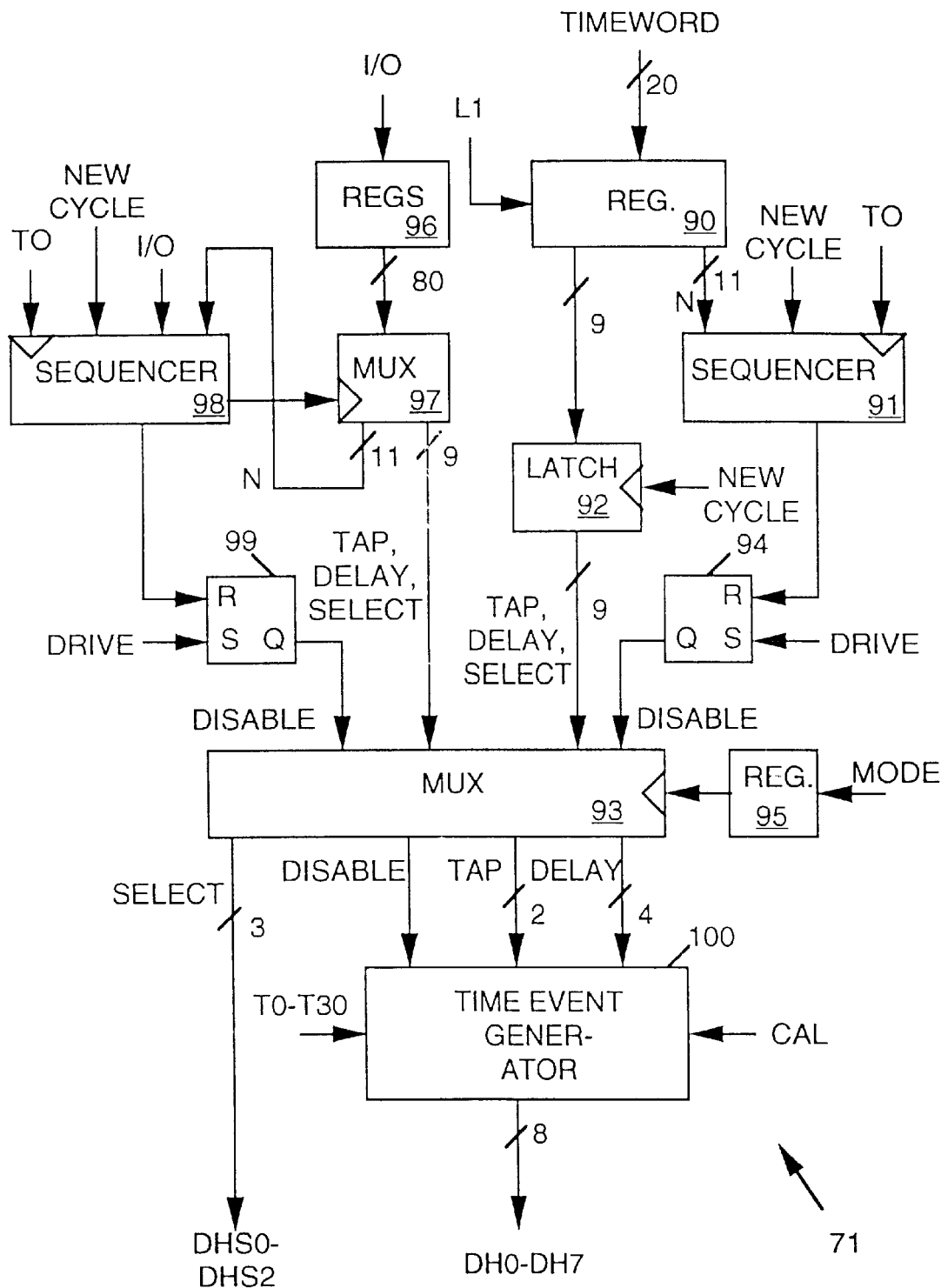
FIG. 6 is a block diagram depicting the drive high circuit of FIG. 5.

FIG. 6 is a block diagram depicting drive high circuit 71 of FIG. 5. Circuits 72–76 of FIG. 5 are similar. Referring to FIG. 6, a register 90 stores the 20-bit TIMEWORD in response to the L1 bit of the ACTIONWORD. The first 11 bits N of the TIMEWORD stored in register 90 are provided as input to a sequencer 91. The remaining 9 bits (TAP, DELAY, and SELECT) of the TIMEWORD stored in register 90 are provided as input to a latch 92. The output of latch 92 is supplied to an input of a multiplexer 93. On receipt of the NEWCYCLE signal from processing unit 36, latch 92 passes the TAP, DELAY and SELECT portions of the TIMEWORD in register 90 to multiplexer 93. On the Nth ROSC signal pulse following the NEWCYCLE signal pulse, sequencer 91 resets a flip-flop 94 having a Q output (DISABLE) provided as an input to multiplexer 93. Flip-flop 94 is set by the DRIVE signal output of latch 80 of FIG. 5. The 20/10 bit multiplexer 93 is controlled by a MODE bit stored in a register 95 by the host computer via I/O control circuit 44 of FIG. 2 prior to the test operation. The MODE bit indicates whether the drive high circuit 71 is to operate in the PROCESSOR or PATTERN mode.

When operating in the PROCESSOR mode, multiplexer 93 passes the three SELECT bits at the output of latch 92 as select signals DHS0–DHS2 to the select control input of multiplexing latch 80 of FIG. 5. Multiplexer 93 passes the remaining six bits (two TAP bits and four DELAY bits) of the output of latch 92 to a time event generator (TEG) circuit 100 which produces the eight timing signals DH0–DH7 supplied to the set input of multiplexing latch 80 of FIG. 5. TEG circuit 100 selects and adjustably delays eight of the thirty one T0–T30 to produce the DH0–DH7 timing signals. The eight timing signals DH0–DH7 are selected in accordance with the TAP bits and the amount each timing signal DH0–DH7 is delayed is determined by the four DELAY bits.

Multiplexer 93 also passes the DISABLE bit output of flip-flop 94 to the TEG circuit 100. When during a test cycle multiplexing latch 80 asserts the DRIVE signal, it sets the DISABLE output bit of flip-flop 94 true. This bit "disables" TEG 100 by telling it to pull its DH0–DH7 output bits of TEG 100 low and hold them low. During the next test cycle, after sequencer 91 has counted N ROSC cycles, it resets flip-flop 94 to drive the DISABLE bit low. This enables TEG 100 to produce the set of DH0–DH7 signal pulses during the next T0 clock cycle.

In the PATTERN mode of operation the host computer, acting through the I/O controller 44 of FIG. 2, stores up to four TIMEWORDS in a set of four registers 96 before a test operation begins. The TIMEWORD stored in each register 96 is applied to a separate input of a multiplexer 97. Multiplexer 97 forwards the nine TAP, DELAY and SELECT bits of a TIMEWORD of one selected register 96 to an input of multiplexer 93. Multiplexer 97 sends the remaining eleven bits of the selected TIMEWORD to an input of a sequencer 98. On each receipt of a NEWCYCLE pulse, sequencer 98 switches multiplexer 97 to select the TIMEWORD for the next test cycle and begins counting T0 signals pulses. When the count reaches N, sequencer 99 resets a flip-flop 99 supplying a DISABLE signal to multiplexer 93. Flip-flop 99 is set by the DRIVE signal. In the PATTERN mode, the MODE bit stored in register 95 selects the TAP, DELAY and SELECT bits from multiplexer 97 and the DISABLE bit from flip-flop 99. The TEG circuit 100 of FIG. 6 and the multiplexing latch 80 of FIG. 2 processes this data in the same manner as in the PROCESSOR mode to determine when to assert the DRIVE signal. Flip-flop 99 operates in a manner similar to flip-flop 94 to disable TEG 100 after it has driven the DRIVE signal high once during the test cycle. The particular pattern sequencer 98 follows when selecting a register 96 after each NEWCYCLE signal is determined by pattern control data supplied to sequencer 98 by the host computer via I/O controller 44 of FIG. 2 before the test operation commences.

To disable the TEG 100 for an entire test cycle the 11 bits N of in a TIMEWORD either stored in a register 96 (for the PATTERN mode or operation) or supplied to register 90 (for the PROCESSOR mode of operation) is set to a value that is higher than the length of the test cycle. In such event, sequencers 98 and 91 will not be able count high enough to reset flip-flops 99 and 94 during each test cycle. As discussed herein below, the I/O control circuit 44 provides TEG circuit 100 with calibration data (CAL) for concise control of the timing of the DH0–DH7 signals.

Figure 7:
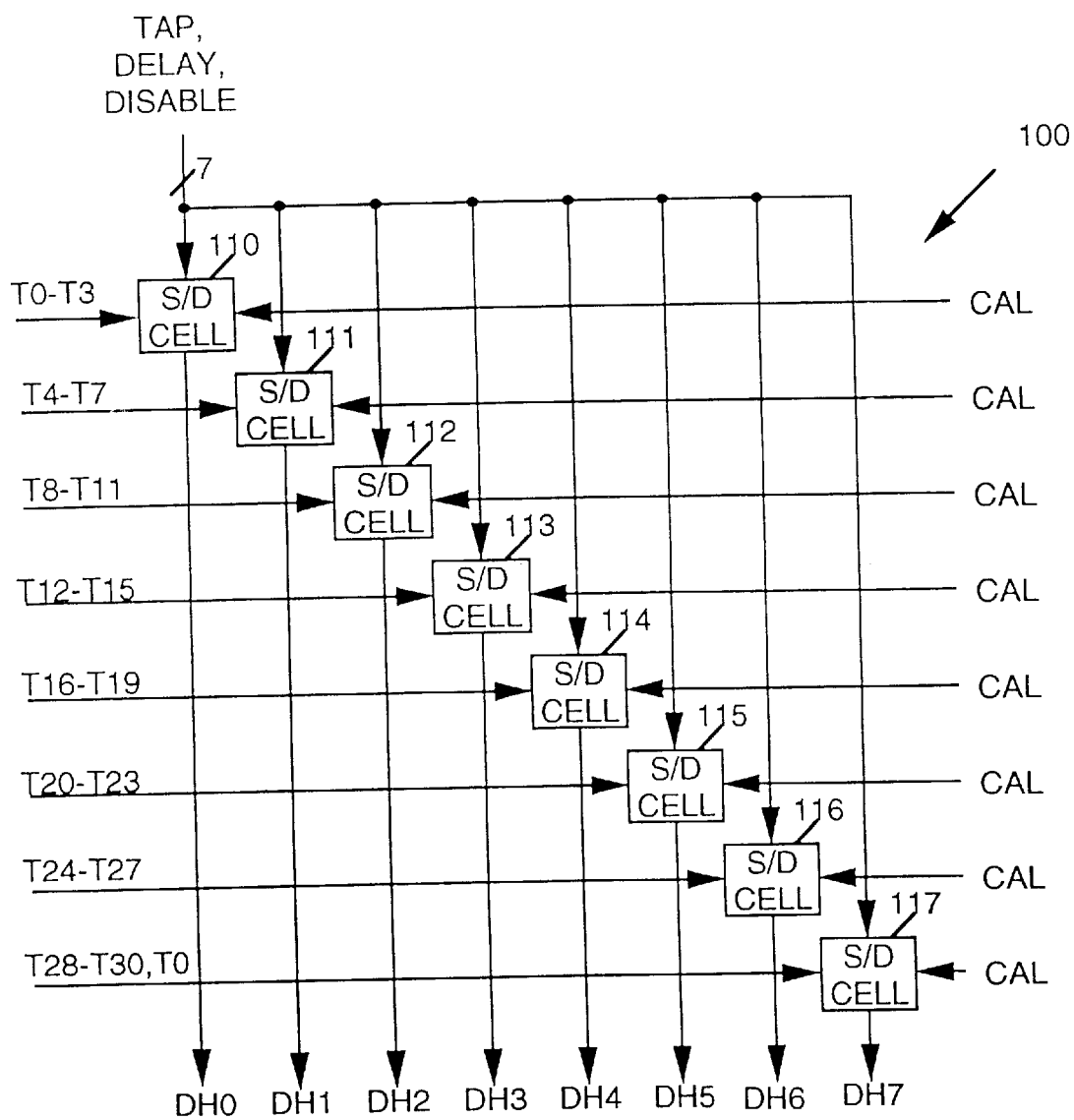
FIG. 7 is a block diagram depicting a typical time event generator of FIG. 6.

FIG. 7 is a block diagram depicting the time event generator 100 of FIG. 6. Time event generator 100 includes a set of 8 identical select and delay (S/D) cells 110–117. When the DISABLE bit is low, S/D cell 110 selects one of timing signals T0–T3 to forward as timing signal DH0 in response to the 2 TAP bits of the TIMEWORD. As S/D cell 110 passes the selected tap signal T0–T3 onward as the DH0 signal, it delays the selected tap signal from 0 to 15 "delay units" as determined by the 4 DELAY bits. When the DISABLE bit is high, cell 110 pulls the DH0 low regardless of the states of the selected timing signal T0–T3. S/D cells 111–117 operate in a similar fashion, each selecting and adjustably delaying one of four oscillator tap signals in response to the TAP and DELAY bits to produce a corresponding output signal DH1–DH7, respectively. As discussed herein below each S/D cell also receives calibration data input from the I/O control circuit 44 of FIG. 2 which adjusts signal propagation delay through the S/D cells for reasons explained below.

The "delay unit" by which the S/D cells can delay the selected tap is 1/16 of the time difference between pulses of successive taps T0–T30 or 1/16th of the delay of one gate 45 of oscillator 42 of FIG. 3. While the phase locked oscillator 42 of FIG. 2 produces tap signals T0–T30 which divide the ROSC signal cycle into 31 time segments, the time event generator 100 can further subdivide each time segment into 16 subsegments. The DELAY data from the TIMEWORD adjusts the timing of each DH0–DH7 signal pulse in steps of 1/(31×16) or one 496th of a ROSC signal cycle. Thus by appropriately selecting and delaying a signal pulse DH0–DH7 we can obtain a reference signal pulse that occurs at any of 496 equally spaced times during a ROSC signal cycle.

Figure 8:
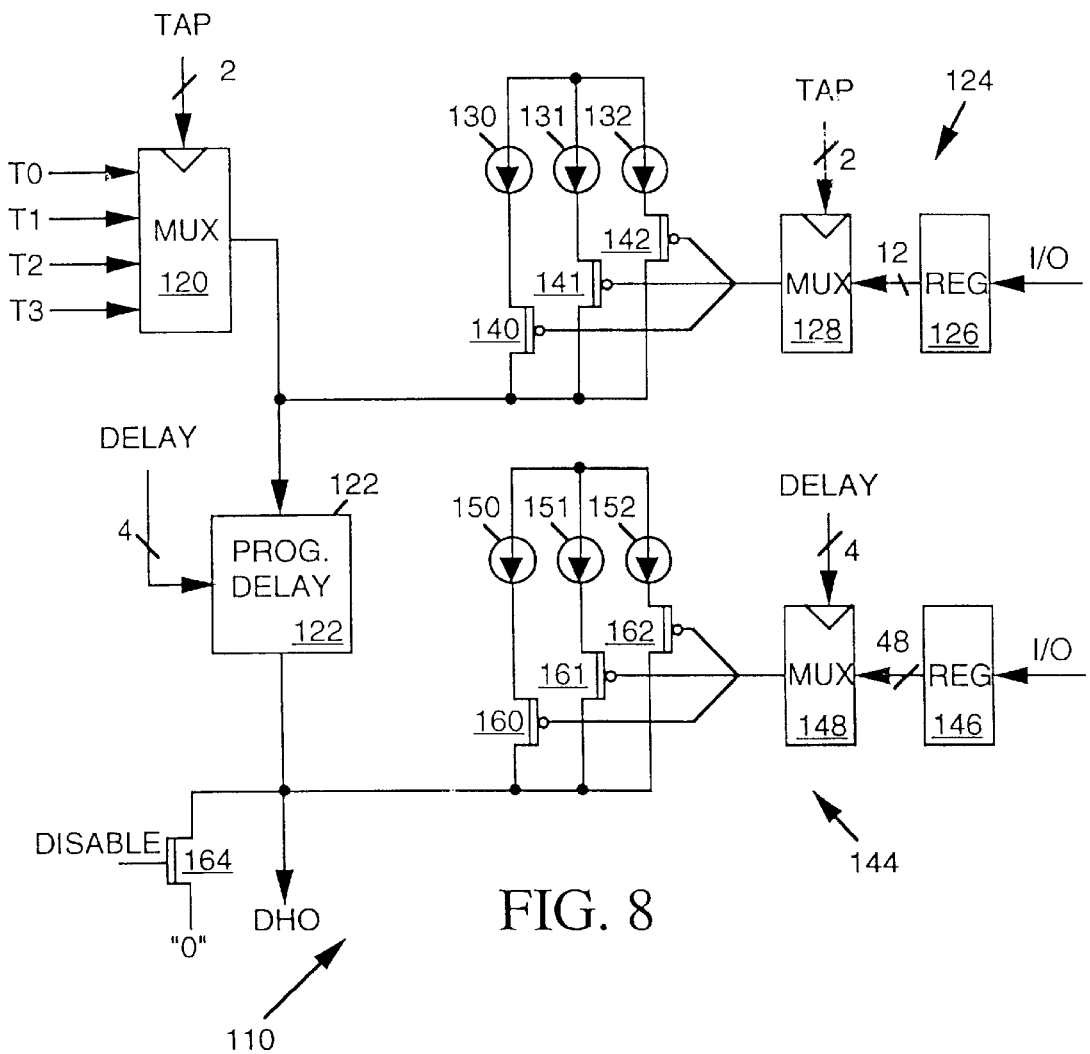
FIG. 8 is a combination block and circuit diagram depicting the TEG0 circuit of FIG. 7.

FIG. 8 is a combination block and circuit diagram depicting S/D cell 110 of FIG. 7. The other S/D cells 111–117 are similar. Referring to FIG. 8, S/D cell 110 includes a multiplexer 120 controlled by the two TAP signal bits. Multiplexer 120 selects one of tap signals T0–T3 to be forwarded to a programmable delay circuit 122. Responding to the four DELAY bits, delay circuit 122 delays the selected tap signal by from 0 to 15 delay units to produce the DH0 output signal. A transistor 164 controlled by the DISABLE bit couples the DH0 signal to a logical "0" (low) source when the DISABLE bit is high. Transistor 164 pulls the DH0 signal down after the DRIVE signal is asserted once during a test cycle so that the selected timing signal T0–T3 will not repeatedly assert the DRIVE signal during the remainder of the test cycle.

As discussed herein above, pulses of the ROSC signal of FIG. 1 arrive at the various nodes 14 at different times and this leads to timing differences between corresponding oscillator tap signals T0–T30 of the separate nodes. Also while the delay circuit 116 of FIG. 3 helps to compensate for node-to-node differences in signal propagation rates due to integrated circuit processing and environmental variations, other factors such as cyclic noise disturbances may give rise to small propagation rate differences. A pair of calibration circuits 124 and 144 further adjust propagation delay of the selected T0–T3 signal to ensure that the propagation delays provided by delay circuits 122 of the separate nodes are equivalent.

A calibration circuit 124 within S/D circuit 110 of FIG. 8 includes a register 126, a multiplexer 128, a set of current sources 130, 131, and 132, and three transistors 140, 141 and 142. Transistors 140–142 respectively couple current sources 130–132 to the input to delay circuit 122. Each bit of a three bit output of multiplexer 128 controls the gate of a separate one of transistors 140–142. The host processor via I/O circuit 44 of FIG. 2 stores 12 bits in register 126, three bits associated with each of the four tap signals T0–T4. Responsive to the value of the 2-bit TAP data, multiplexer 128 selects 3 of the bits in register 126 to control the switching states of transistors 140–142. Thus the particular current sources 130–132 coupled to the input of delay circuit 122 are selected according to which tap T0–T3 is currently selected and the value of associated data stored in register 126.

Current sources 130–132 produce currents of relative sizes 1, 2, and 4, respectively and by selectively turning on transistors 140–142, the amount of current supplied to the input of delay circuit 122 can be of any relative magnitude 0–7. This current precharges input capacitance of the delay circuit 122 so that when multiplexer 120 passes a signal on to the delay circuit, the delay circuit responds more quickly. By increasing the amount of current available for precharging that input capacitance we reduce the propagation delay. Thus the data loaded into register 126 separately calibrates the propagation delay for each timing signal T0–T3.

The second calibration circuit 144 includes a register 146, a multiplexer 148, a set of current sources 150, 151, and 152, and three transistors 160, 161 and 162. Transistors 160–162 respectively couple current sources 150–152 to the output of delay circuit 122. Each bit of the 3-bit output of multiplexer 148 controls the gate of a separate one of transistors 160–162. I/O circuit 44 of FIG. 2 stores 48 bits in register 146, three bits associated with each of the 16 possible delays selected by the 4-bit DELAY data. Responsive to the value of the 4-bit DELAY data, multiplexer 128 selects three of the bits in register 146 to control the switching states of transistors 160–162. Thus the particular current sources 150–152 coupled to the output of delay circuit 122 are determined according to the selected amount of delay in delay circuit 122 and the value of associated data stored in register 146. Calibration circuit 144 operates in a manner similar to calibration circuit 126 to adjust propagation delay in the circuit by pre-charging the input capacitance of the next stage so as to speed up or slow down the response of the next stage to the DH0 signal.

During a calibration process all nodes of FIG. 1 are operated so as to assert an output test signal at the same time and the DUT is replaced with equipment for measuring small time differences between signal pulses. With transistors 140–142 off, the delay of delay circuit 122 set to a minimum and multiplexer 120 in all nodes is switched to select T0. If all nodes are properly calibrated then all nodes will assert their test signals at the same time. Timing differences are monitored and the 3 data bits stored in register 126 associated with tap T0 are adjusted on an iterative basis for all of the nodes until they all produce their test output signals at the same time within the resolution provided by calibration circuit 124. The process is repeated for each of the reference signals T1–T3 for all of the nodes.

Thereafter the T0 tap is selected in each node, test signal timing is compared for all different delay settings of delay circuit 122 and the data in register 146 is iteratively adjusted to ensure that all nodes assert test signals at the same time for each setting of delay circuit 122 within the resolution afforded by calibration circuit 144. The calibration process is repeated for all S/D cells 111–117 of time event generator 100 of FIGS. 6 and 7 and for similar time event generators included in the drive low, sample high, sample low, tristate high and tristate low circuits 71–76, respectively, of FIG. 5.

Figure 9:
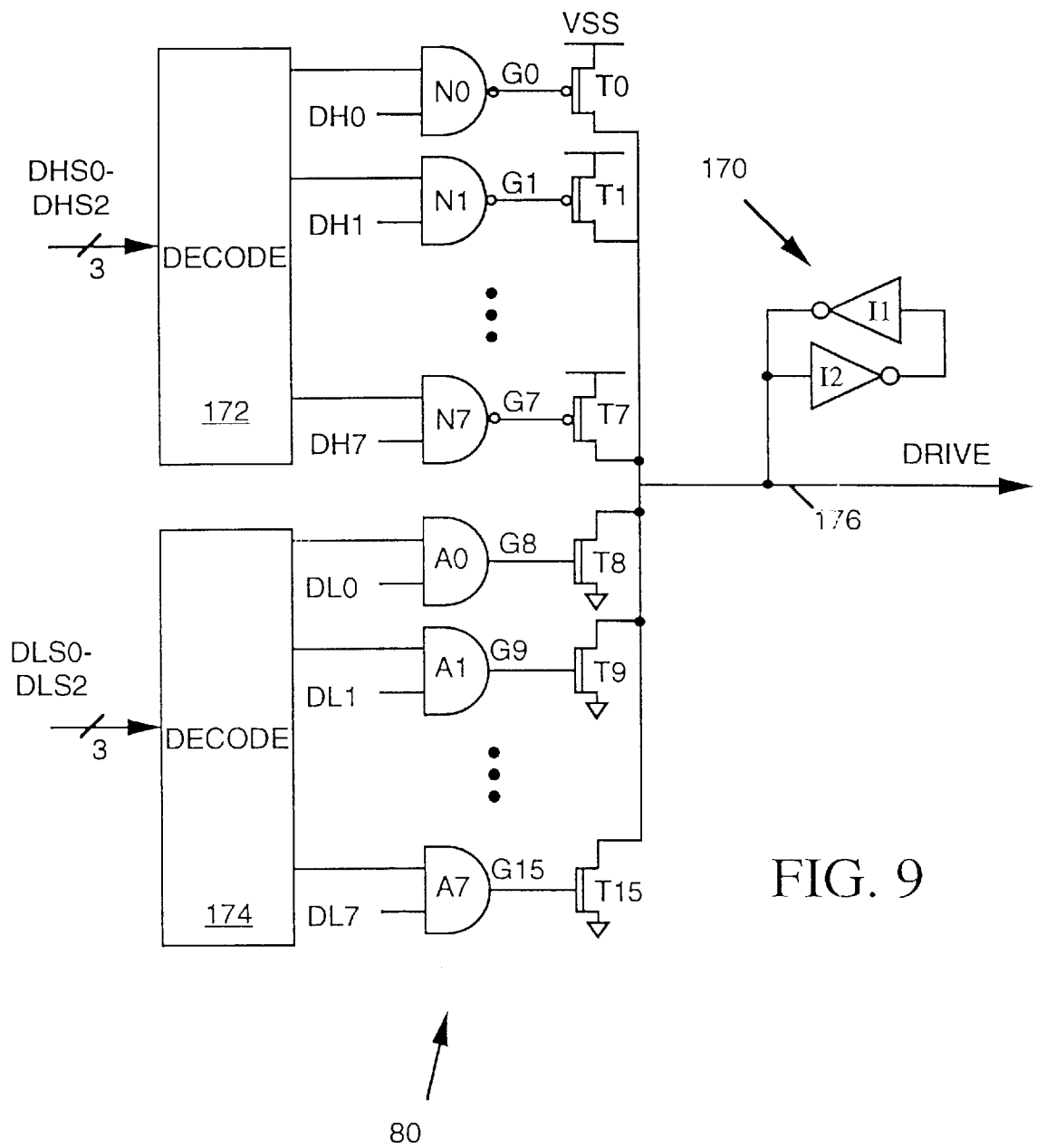
FIG. 9 is a combination block and circuit diagram depicting a typical multiplexing latch of FIG. 5.

FIG. 9 is a combination block and circuit diagram depicting a typical multiplexing latch 80 of FIG. 5. Multiplexing latches 82 and 84 are similar. Multiplexing latch 80 includes eight CMOS NAND gates N0–N7, eight CMOS AND gates A0–A7, eight pMOS transistors T0–T7, eight nMOS transistors T8–T15, a bistable latch 170 and a pair of decoders 172 and 174. Drive high select signals DHS0–DHS3 provide input to decoder 172. Decoder 172 has eight outputs, each driving an input of a separate one of NAND gates G0–G7 and each asserted in response to a separate combination of decoder input bits. Decoder 174 decodes the drive low select signals DLS0–DLS2 to produce eight outputs, each driving an input of a separate one of AND gates A1–A7 in response to a separate combination of DLS0–DLS2 bits.

The DH0–DH7 drive high timing bits are applied to second inputs of NAND gates N0–N7, respectively, and the DL0–DL7 drive low bits are applied to second inputs of AND gates A1–A7, respectively. Outputs of NAND gates N0–N7 control gates of transistors T0–T7, respectively, and outputs of AND gates A0–A7 control gates of transistors T8–T15, respectively. The source of each transistor T0–T7 is tied to a common voltage source VSS while the source of each transistor T8–T15 is tied to ground. The drains of all transistors T0–T15 are connected together at a node 176. Bistable latch 170 consists of a pair of CMOS inverters I1 and I2. The output of I2 is connected to the input of I1, and the output of I1 is connected to the input of I2 as well as to circuit node 176. The latch output signal DRIVE appears at the circuit node 176.

In response to a particular DHS0–DHS2 bit pattern, decoder 172 drives high an input to, for example, NAND gate N0. When NAND gate N0 subsequently receives a pulse from timing signal DH0, it turns on transistor T0, thereby pulling the DRIVE signal high. As the DRIVE signal swings high, the output of inverter I2 goes low and in turn causes the output of inverter I1 to go high. After timing signal DH0 goes low, the output of inverter I1 continues to pull up on the DRIVE signal. Thus the DRIVE signal is latched high until reset.

Thereafter to reset the DRIVE signal to a low logic level, decoder 174, responding to some particular bit pattern in DLS0–2 drives high an input to, for example, AND gate A0. When AND gate A0 subsequently receives a pulse from timing signal DL0, it turns on transistor T8, thereby pulling the DRIVE signal low. Transistor T8 is relatively large compared to transistors forming inverters I1 and I2 and overcomes their latching action. As the DRIVE signal goes low, the output of inverter I2 goes high and in turn causes the output of inverter I1 go low. After timing signal DL0 goes low, the output of inverter I1 continues to pull DRIVE low. The DRIVE signal thereafter remains in the low logic state until reset to a high state by one of the drive high signals DH0–DH7.

Figure 10:
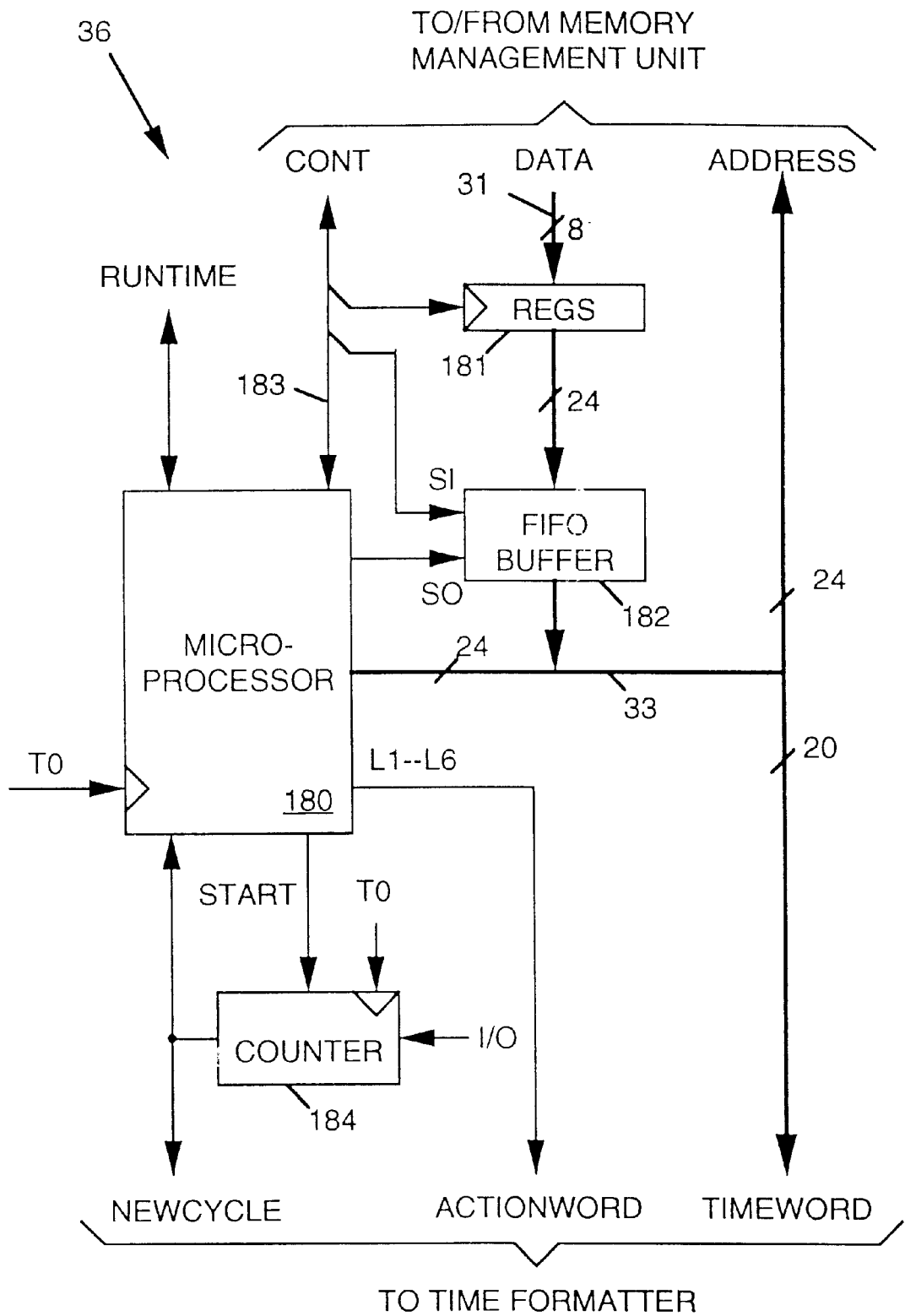
FIG. 10 is a block diagram depicting the instruction processing unit of FIG. 2.

FIG. 10 is a block diagram depicting the instruction processing unit 36 of FIG. 2. Instruction processing unit 36 includes a microprocessor 180 which executes instructions conveyed on local bus 31 from memory 34 of FIG. 2 via memory management unit 32. When microprocessor 180 sends a 24-bit starting address to memory management unit 32 of FIG. 2 via bus 33 and signals memory management unit 32 via control lines 183, memory management unit 32 responds by reading three 8-bit data words out of memory 34 of FIG. 2 starting at the indicated address. Memory management unit 32 loads the three 8-bit data words in a set of 3 registers 181 and then concurrently loads the registers' contents as a 24-bit data word into a first-in/first-out (FIFO) buffer 182 by asserting a shift in control signal SI on control lines 183. Memory management unit 32 of FIG. 2 continues to read 8-bit data words out at successive addresses of memory 34 and to shift them as 24-bit words in FIFO buffer 182 until the FIFO buffer is full. Memory management unit 32 then signals microprocessor 180 via control lines 183 telling it that instructions are available in FIFO buffer 182.

Microprocessor 180 then sequentially generates a shift out signal SO causing FIFO buffer 182 to shift out a next instruction onto bus 33. Microprocessor 180 then reads and executes the instruction appearing on bus 33. These instructions form an algorithm telling microprocessor 180 to generate a sequence of commands, each command including a TIMEWORD and an ACTIONWORD. As discussed herein above, an ACTIONWORD indicates a particular action to be taken during a next test cycle and a TIMEWORD indicates a time during the next test cycle when the time formatter of FIG. 4 is to initiate the indicated action. The microprocessor 180 outputs the ACTIONWORD portion of the command on a set of six control lines L1–L6 and outputs the 20-bit TIMEWORD portion of the command on bus 33. Lines L1–L6 and 20 lines of bus 33 convey the ACTIONWORD/TIMEWORD command to the time formatter circuit 38 of FIG. 5.

Before a test operation begins, the host processor, via I/O circuit 44 of FIG. 2 stores a data value in a counter 184 within instruction processing unit 36 indicating the length of each test cycle in terms of a number of T0 signal cycles. Upon receipt of a START control signal from microprocessor 180, counter 184 begins counting T0 signal pulses. When the count reaches the indicated limit, counter 184 generates a NEWCYCLE pulse and restarts its count of T0 signal pulses. As discussed previously the NEWCYCLE pulse is sent to circuits 71–76 of FIG. 5 to indicate when a new test cycle is to begin.

Microprocessor 180 can assert any of four RUNTIME output signals, each being sent to a separate one of the four links 30 of FIG. 2. Microprocessor 180 can also receive any of four RUNTIME input signals, one from each link 30. The output RUNTIME signals permit microprocessor 180 to signal the host computer or other nodes during a test operation when instructed to do so, for example to indicate test completion. The input RUNTIME signals allow the host computer or other nodes to signal microprocessor 180 during a test, for example to mark the beginning or end of a test or to tell microprocessor 180 to execute an interrupt routine.

At the start of a test, microprocessor 180 responds to a RUNTIME signal by sending the START signal to counter 184 to tell it to begin counting T0 signal cycles and by sending a first address to the memory management unit via bus 33. Memory management unit then sends a sequence of instructions to FIFO buffer 182. As microprocessor 180 reads out and executes the instructions, it sends a TIMEWORD/ACTIONWORD command to the time formatter 38 of FIG. 2 for each action that is to be carried out during the next test cycle. Whenever FIFO buffer 182 is depleted of instructions, microprocessor 180 sends another address to the memory management unit 32 of FIG. 2 and the memory management unit reloads the FIFO buffer with a next set of instructions. A last instruction during each cycle tells microprocessor 180 to rest until it receives a NEW-CYCLE signal from counter 184 indicating the start of a new test cycle. Microprocessor 180 then resumes reading instructions out of FIFO buffer 182 and executing them to generate TIMEWORD/ACTIONWORD commands for the next test cycle. The process continues for each cycle of the test. At the end of a test operation, a last instruction may tell microprocessor 180 to assert an output RUNTIME signal indicating test completion. Network interface 30 of FIG. 2 can be configured to forward that signal to the host processor or other nodes as appropriate.

Figure 10A:
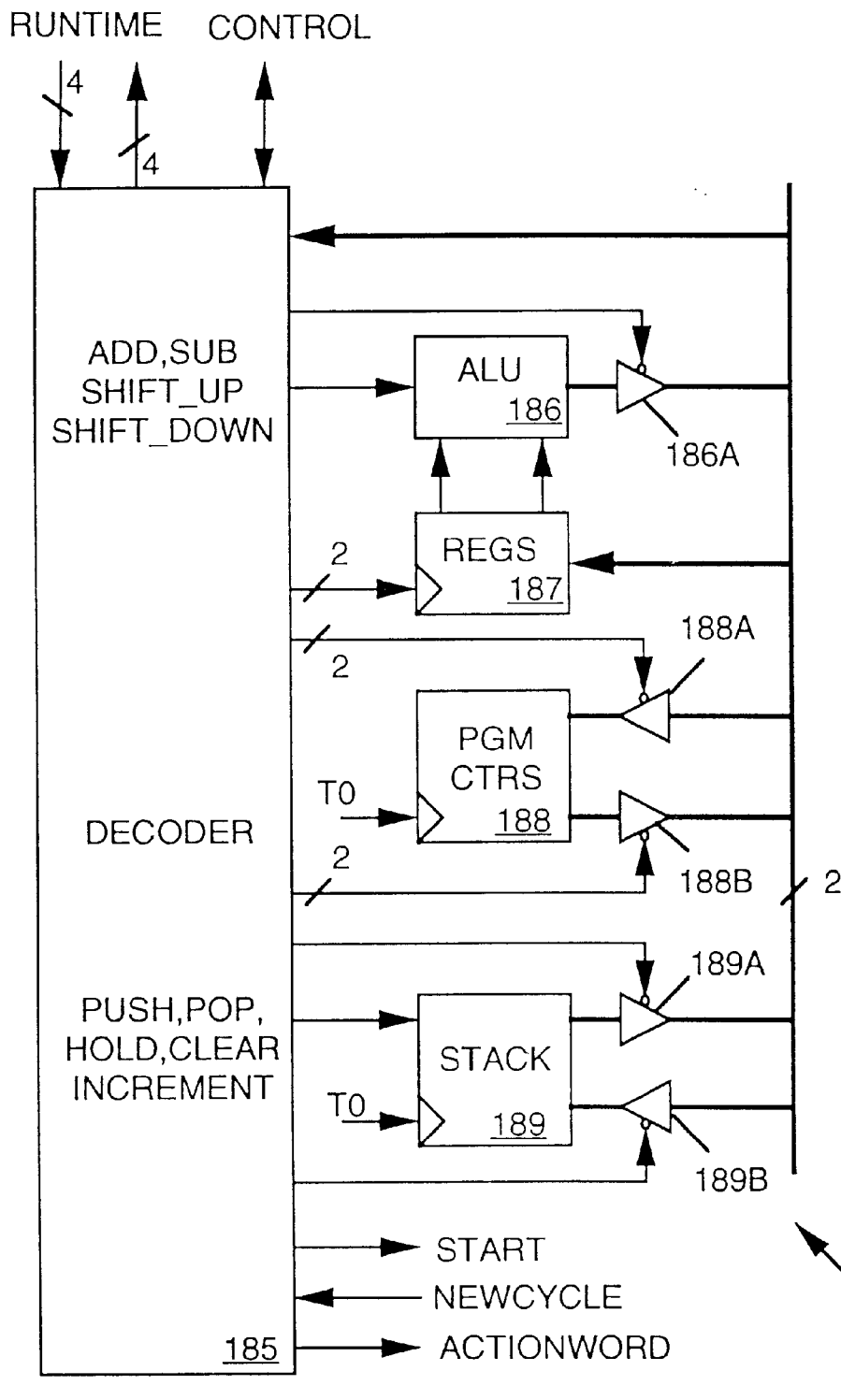
FIG. 10A is a block diagram depicting the microprocessor of FIG. 10.

FIG. 10A is a block diagram illustrating a suitable architecture for microprocessor 180 of FIG. 10. The primary function of microprocessor 180 is to execute algorithmic instructions including adding, subtracting, an bit shifting, and utilizing subroutines, recursion, branching and other well-known algorithmic techniques so as to produce commands sequences. Each command includes a TIMEWORD produced on bus 33 and an ACTION word produced on six lines L1–L6.

Those skilled in the art will appreciate that a number of well-known 24-bit microprocessor architectures may implement such functions. In the preferred embodiment, microprocessor 180 includes instruction decoder 185, an arithmetic logic unit (ALU) 186, a pair of registers 187, a pair of program counters 188 and stack circuitry 189. Instruction decoder 185 decodes 24-bit instructions on bus 33 to produce several control output bits. Some of these bits control loading of data into registers 187 and select operations to be performed by ALU 186. ALU 186 has an output selectively coupled to bus 33 via a tristate buffer 186A controlled by decoder 185. ALU 186 has two inputs, each connected for receiving data stored in a separate one of the two registers 187. Registers 187 receive and store data appearing on bus 33 when input enabled by signals from decoder 185. ALU 186 can produce an output that is selectively either the sum of or difference between the two values stored in registers 187, or which is a bit-shifted (multiplied by 2 or divide by 2) version of a value stored in either register. ALU 186 is useful, for example, when generating a sequence of TIMEWORDS wherein each successive TIMEWORD represents a time that is phase shifted from the last by a constant amount. Program counters 188 have outputs coupled to bus 33 through tristate buffers 188A and inputs coupled to bus 33 through tristate buffers 188B. Buffers 188A and 188B are controlled by signals from decoder 185. Counters 188 are useful for keeping track of instruction addresses. Stack circuits 189 controlled by decoder 185, have outputs receiving addresses on bus 33 via tristate buffers 189A and inputs for placing addresses on bus 33 via 189B via tristate buffers 189B. Stack circuits 189 include program counters, stack registers and other circuitry operating in a well-known manner to push, pop, clear, hold or increment subroutine return addresses under decoder 185 control.

Figure 11:
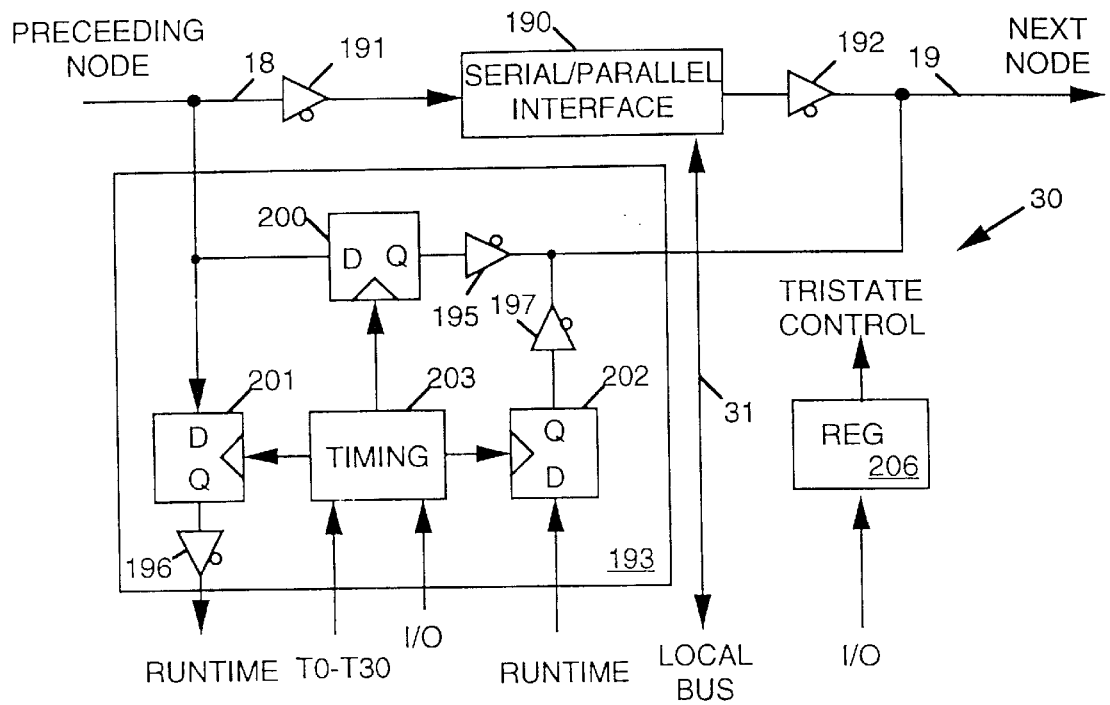
FIG. 11 is a block diagram illustrating the network interface of FIG. 2.

FIG. 11 is a block diagram illustrating one network interface 30 of a set of four network interface 30 of FIG. 2. Each link 30 receives data on a separate serial input transmission line 18 from a preceding network node and transmits data on a serial output transmission line 19 to the next network node with a well defined transmission time. This allows for very high uni-directional bandwidth which is not possible with standard buses. A tristate buffer 191 can selectively couple the incoming transmission line 18 to a serial/parallel interface circuit 190. Another tristate buffer 192 can selectively couple the serial/parallel interface circuit 190 to the outgoing transmission line 19. Interface circuit 190, suitably an IEEE standard 1596-1993 scalable coherent interface, receives data from transmission line 18 in serial form and forwards it onto outgoing transmission line 19 in serial form and forwards it onto local bus 31 parallel form. Serial/parallel interface circuit 190 can also transmit parallel data received on bus 31 outward in serial form on transmission line 19.

A synchronizing circuit 193 provides precise timing for transmission and receipt of RUNTIME signals conveyed on the incoming transmission line 18 and outgoing transmission line 19. Synchronizing circuit 193 comprises three tristate buffers 195–197, three type D flip-flops 200–201, and a timing circuit 203. Ringlet 18 is tied to D inputs of flip-flops 200 and 201 and buffer 195 couples the Q output of flip-flop 200 to outgoing transmission line 19. Buffer 196 conveys a RUNTIME signal to the instruction processing unit 36 from the Q output of flip-flop 201. A RUNTIME signal produced by the instruction processing unit 36 of FIG. 2 drives the D input of flip-flop 202. Buffer 197 couples the RUNTIME signal at the Q output of flip-flop 202 onto outgoing transmission line 19. The timing circuit 203 controls the clock inputs of flip-flops 200–202 in response to control input from the I/O controller 44 of FIG. 2 using the timing signals T0–T30 for reference. A register 206 stores a data word from the I/O controller 44 of FIG. 2, each bit of the stored data word controls enabling of tristate buffers 190–197.

When transmission lines 18 and 19 are used for conveying instructions or control data from node to node, buffers 191 and 192 are enabled thereby placing interface circuit 190 between the transmission lines. In this configuration, a host computer can access the local bus 31 of every node via the serial parallel interface 190. With access to bus 31, the host computer can write instruction into memory 34 of FIG. 2 via memory management unit 32, can write control data into the various devices 36, 38 and 40 of FIG. 2 via the I/O controller 44 of FIG. 2 and can read acquired test data out of the acquisition memory within the DUT interface circuit 40 of FIG. 2 via I/O controller 44.

During a test operation, transmission lines 18 and 19 can be used to convey RUNTIME signals into and away from the node. In such mode, buffer 195 is enabled and timing circuit 203 periodically clocks flip-flop 200 thereby latching a RUNTIME signal appearing on transmission line 18 onto transmission line 19. When the node is supposed to respond to a RUNTIME signal on transmission line 18, buffer 196 is also enabled and timing circuit 203 periodically clocks flip-flop 201 so that flip-flop 201 forwards the RUNTIME signal appearing on transmission line 18 on to processing unit 36 of FIG. 2. When the node is supposed to generate a RUNTIME signal during a test operation, buffer 197 is enabled. Timing circuit 203 periodically clocks flip-flop 202 causing flip-flop 202 to periodically latch its RUNTIME signal input into transmission line 19.

Figure 12:
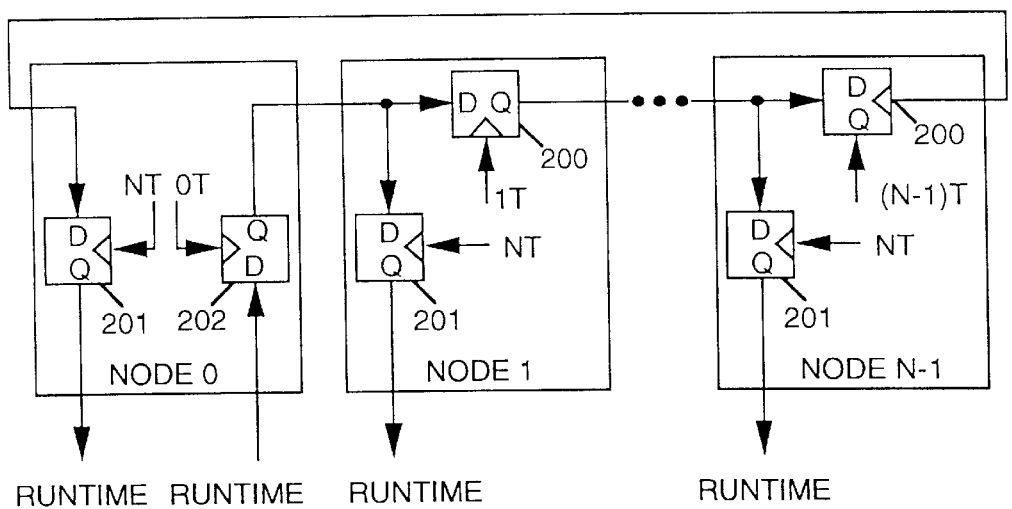
FIG. 12 is a block diagram illustrating selected portions of a set of interconnected network interface of FIG. 11.

FIG. 12 is a block diagram illustrating of how RUNTIME signals pass from node to node though a network interface. FIG. 12 shows relevant portions of each link 30 of a network consisting of N nodes labeled node 0 through node N-1 connected in a loop with the outgoing transmission line 19 of each node connected to the incoming transmission line 18 of the next. In the example, the processor of node 0 generates a RUNTIME signal that passes around the network loop to the link in each node and from the link to the instruction processing unit within each node. In the example of FIG. 12, the buffers 191, 192 and 195–197 of FIG. 11 are not shown, but it is assumed that buffers 191 and 192 of all nodes are disabled, buffer 196 of all nodes is enabled, buffer 195 is disabled in node 0 only, and buffer 197 is enabled in node 0 only.

To provide for synchronous response to a RUNTIME signal by all nodes, pulses of the RUNTIME signal should be delivered to all microprocessors within all nodes at the same time. Obviously a RUNTIME pulse originating at node 0 will not arrive at all nodes at the same time. However a RUNTIME pulse originating at node 0 is sequentially latched onto the D input of flip-flop 200 of each successive node of the loop and thereafter concurrently clocked through all flip-flops 201 so that the signal is sent to each node's microprocessor at the same time.

Figure 13:
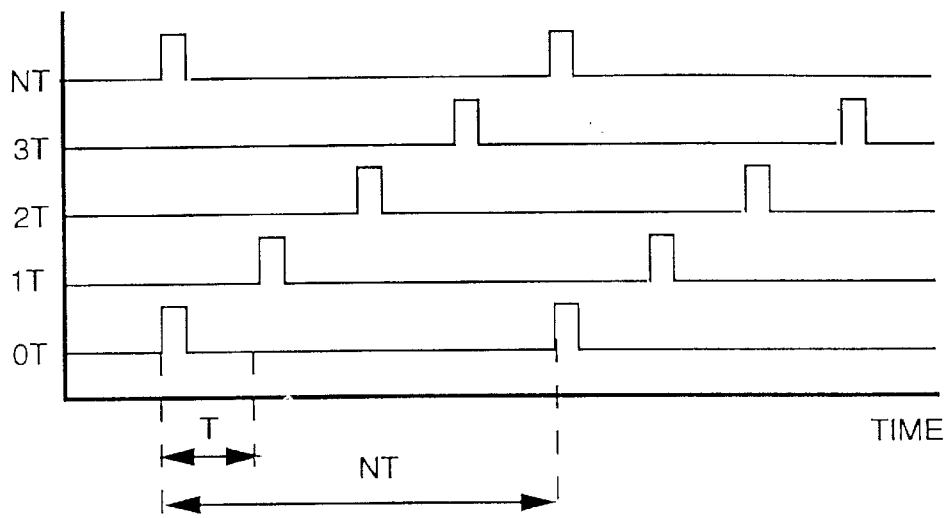
FIG. 13 is a diagram illustrating relative timing of signals in FIG. 12.

FIG. 13 illustrates flip-flop timing for FIG. 2 given the number of nodes N is equal to 4. All of the timing signals 0T, 1T . . . NT have the same period N*T, where T is a unit delay period and is suitably greater than or equal to the maximum possible signal propagation delay through the slowest node of the network. Signal 0T, which clocks flip-flop 202 of node 0, and signals NT, which clock flip-flops 201 of all nodes, are in phase with one another. However all other signals 1T-NT are phase shifted one from another by T picoseconds.

When node 0 asserts the RUNTIME signal, flip-flop 202 of node 0 does nothing until the 0T signal clocks it a time 0. At that point the RUNTIME signal state passes to the Q output of flip-flop 202 of node 0 and appears at the D inputs of flip-flops 200 and 201 of node 2. T picoseconds later, flip-flop 200 of node 1 is clocked, thereby passing the RUNTIME signal to flip-flops 200 and 201 of node 2. A time 2*T, flip-flop 200 of node 2 is clocked, thereby passing the RUNTIME signal to flip-flops 200 and 201 of node 3. This process continues until at time (N-1)*T flip-flop 200 of node N is clocked thereby passing the RUNTIME signal to flip-flop 201 of node 0. At that point, the same RUNTIME signal state appears at the D inputs to all latches 201. Finally at time N*T signals NT concurrently clock flip-flops 201 of all nodes so that they simultaneously transmit the RUNTIME signal to their instruction processing units.

Figure 14:
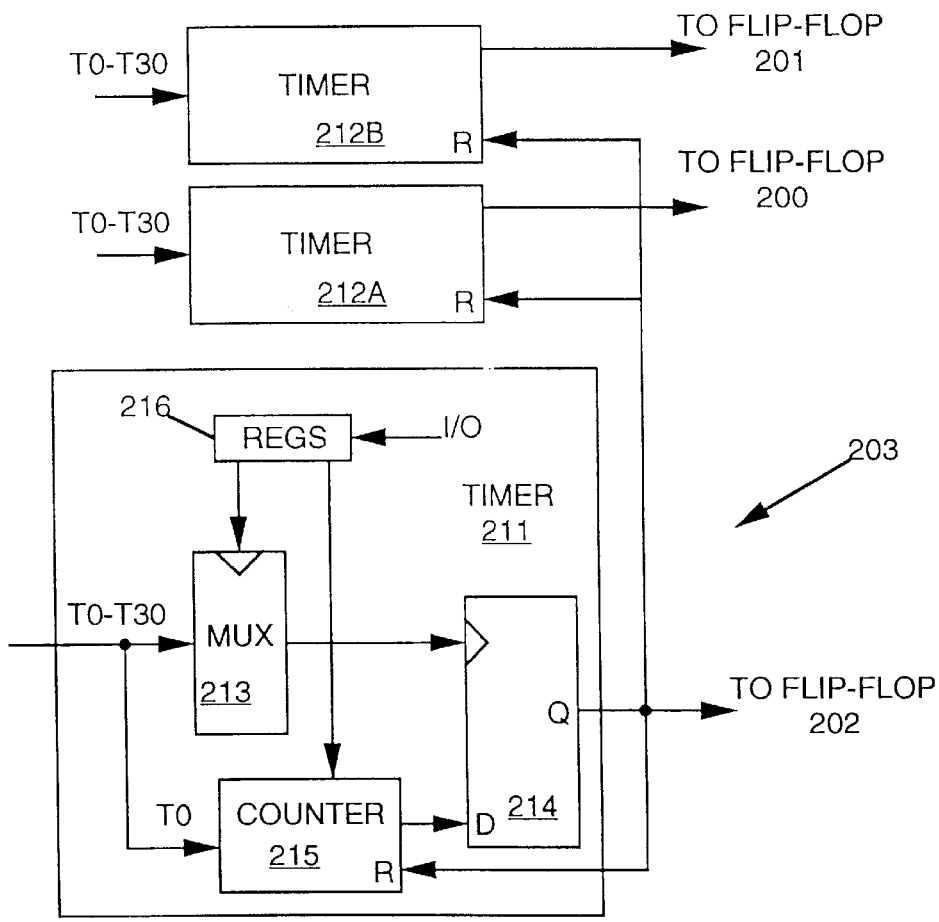
FIG. 14 is a block diagram illustrating the timing circuit of FIG. 11.

FIG. 14 is a block diagram illustrating timing circuit 203 of FIG. 11 which provides the flip-flop clocking signals to flip-flops 200–202. Timing circuit 203 includes a timer 211 produces a timing signal clocking flip-flops 202 of FIG. 11 and timers 212A and 212B producing timing signals clocking flip-flops 200 and 201 of FIG. 11. Timer 211 includes a set of registers 213 containing control data transmitted thereto from the host computer via the I/O controller 44 of FIG. 2 before the start of a test operation. A multiplexer 215 under control of data in registers 216 selects one signal from among reference timing signals T0–T30 produced by oscillator 42 of FIG. 2 and forwards it to a clock input of a type D flip-flop 214. A counter 215 counts T0 signal pulses and provides an output signal pulse to the D input of flip-flop 214 whenever the count reaches a limit indicated by data in registers 212. The Q output of flip-flop 214, which resets the count of counter 215, provides the timing signal that clocks flip-flop 202 of FIG. 11. The data in registers 216 is set so that the timing signal at the Q output of flip-flop 214 has period N*T.

Timers 212A and 212B are similar to timer 211 except that their internal counters are reset by the output of timer 211, rather than their own outputs. Since their internal counters are reset by the NT signal, their output signals each also have a period of N*T. However by adjusting the control data in timers 212A and 212B, their output signals can be phase shifted from the NT signal by any desired amount.

Each node in the preferred embodiment of the tester includes four links similar to the one link 30 illustrated in FIG. 11. Each link of a node has a separate incoming transmission line 18 and a separate outgoing transmission line 19. All four links can couple their incoming and/or outgoing transmission lines to local bus 31, though not concurrently. The four links in each node are connected to corresponding links of their two neighboring nodes to form four independent loop networks. These four independent networks allow the tester to be configured in a variety of ways as illustrated herein below.

The host computer interface 20 of FIG. 1 is substantially similar in construction and operation to the links 30 of FIG. 2 included in each node.

Figure 15:
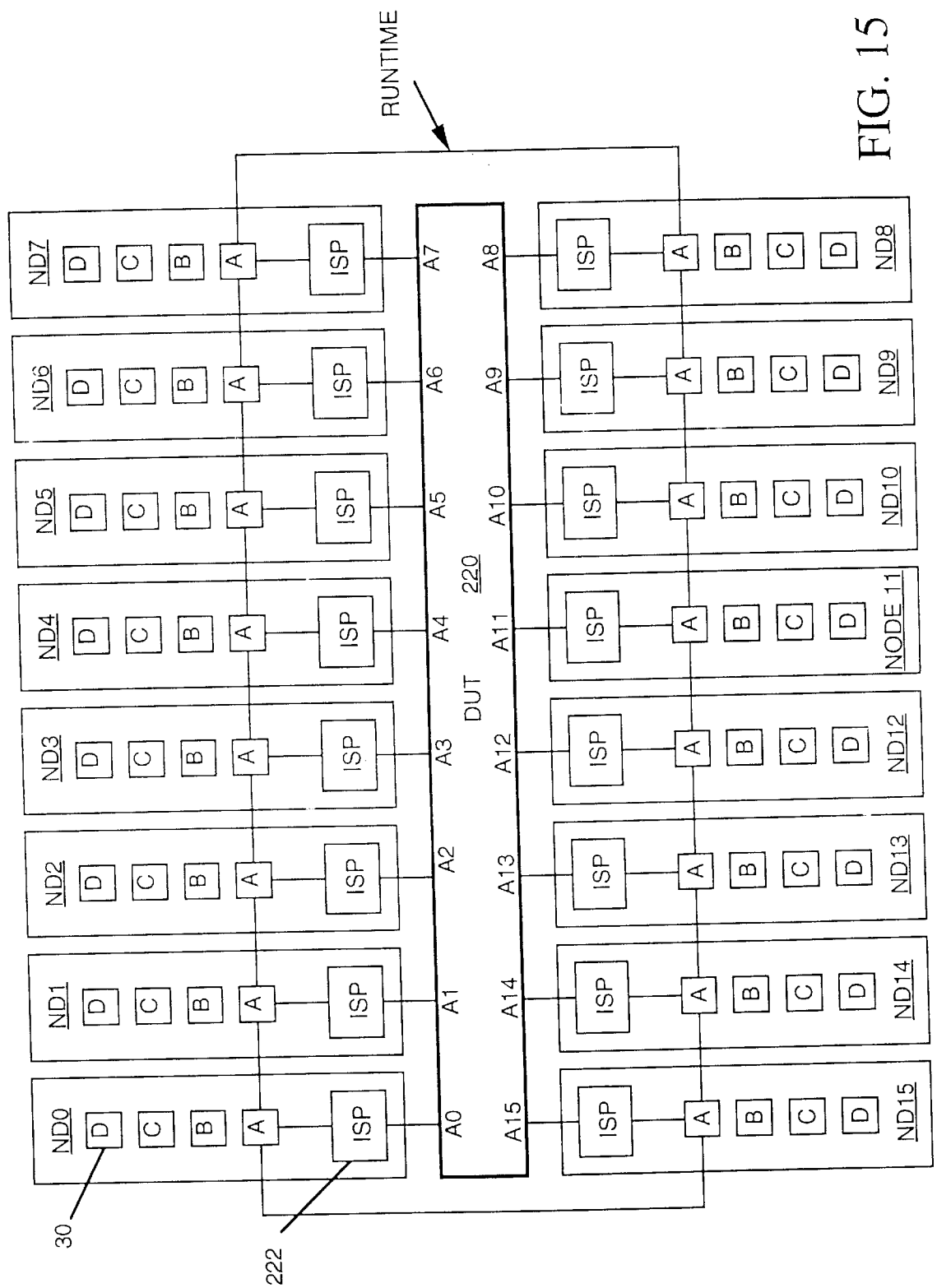
FIGS. 15–17 are block diagrams illustrating various operating configurations for the integrated circuit tester of FIG. 1.

FIG. 15 is a block diagram illustrating a "one node per pin" operating configuration for the integrated circuit tester 10 of FIG. 1 in which the tester performs a test on a single sixteen pin DUT 220. The DUT pins are labeled A0 through A15. The tester as shown in FIG. 15 has only 16 nodes ND0 through ND15, though a tester may have a much larger number of nodes and may have more nodes than pins on the DUT. As illustrated in FIG. 15, each node ND0–ND15 includes four links (A–D) along with the instruction storage and processing (ISP) portions of the node 14, including everything shown in FIG. 2 except the network interface 30. Each node ND0–ND15 is connected to a corresponding pin A0–A15 of the DUT 220 for transmitting test signals thereto and/or receiving output signals therefrom. The host processor is not shown.

In this configuration, the instruction memory in each node stores all of the instructions needed to define the test signal and data acquisition operations for the DUT pin to which the node is connected. The only communication between nodes 14 during a test is via a RUNTIME signal. In the example of FIG. 15, links A of the 16 nodes are coupled in a manner similar to that shown in FIG. 12 and convey the RUNTIME signal from node to node during the test operation. The remaining links B–D are inactive because their tristate buffers 191–197 (FIG. 11) are not enabled. If more than one RUNTIME signal were needed during a test, one or more other links B–D could be activated by turning on the appropriate buffers 195–197 (FIG. 11).

Figure 16:
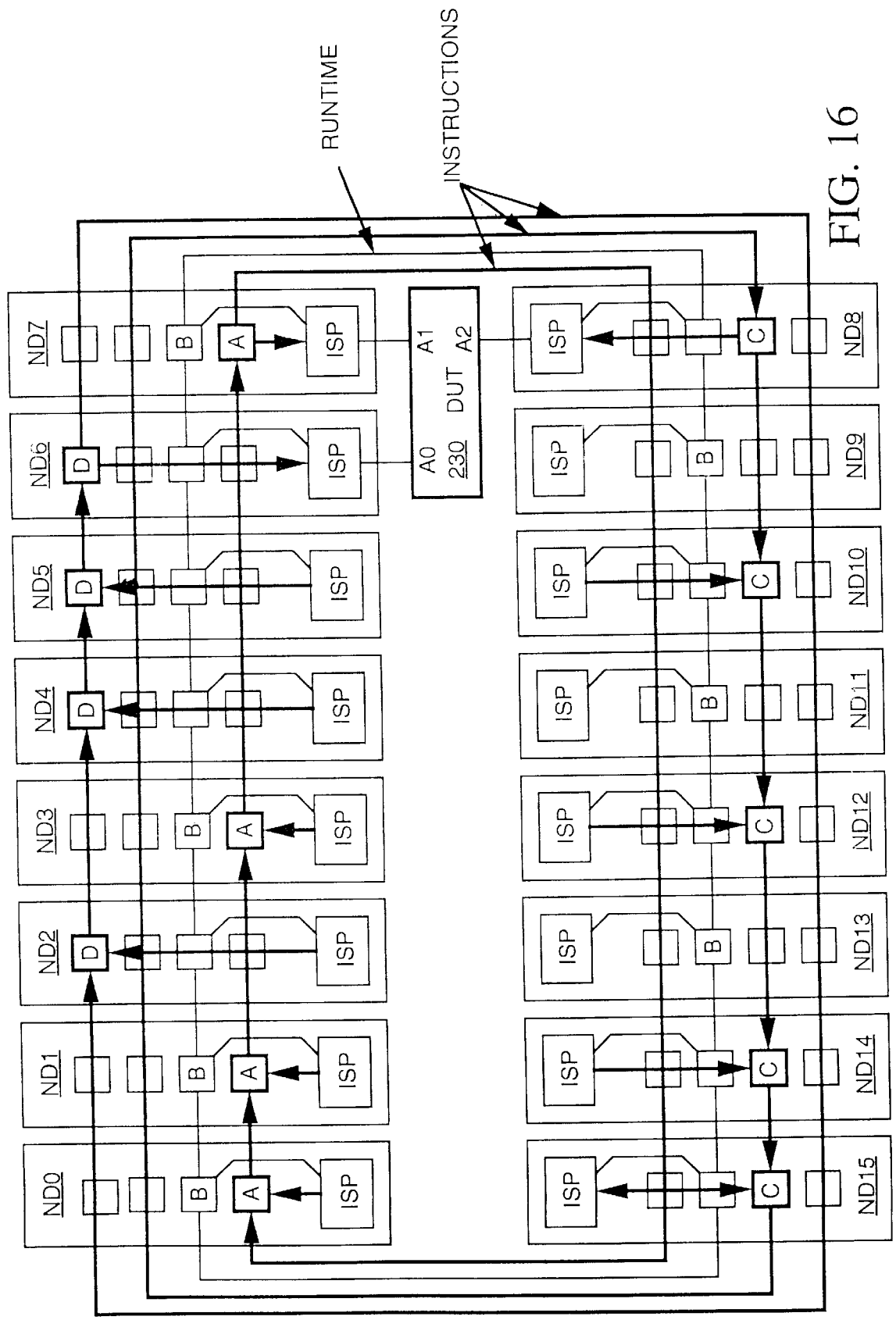

FIG. 16 is a block diagram illustrating a "multiple node per pin" operating configuration for the integrated circuit tester of FIG. 1. In this configuration the tester performs a test on a DUT 230 in which the instruction storage requirements for one or more pins exceeds the capacity of the local instruction memory. In such case the system makes use of available instruction memory capacity in other nodes. In the simplified example of FIG. 16, DUT 230 has only three pins A0 through A2 accessed by nodes ND6, ND7 and ND8, respectively. The remaining nodes are not connected to DUT pins. During a test operation, the A, C and D links of all nodes are interconnected for node to node serial data transmission. With reference to FIG. 11, the link A buffers 191 and 192 are enabled and buffers 195–197 are disabled. During the test, the ISP circuit of node 7 reads instructions not only out of its own local instruction memory but also out of the instruction memories of nodes ND0, ND1 and ND3 via the A link network. Similarly node ND8 may acquire instructions from nodes ND10, ND12 and ND14 via the C link network and node ND6 can acquire instructions from nodes ND2, ND4 and ND5 via the D links. In the meantime, the B links of all the nodes may be interconnected as in FIG. 12 to provide a RUNTIME signal path.

One of the other nodes not connected to a DUT pin and not storing instructions for another node, for example node ND15, may function as a "host computer". That is the instructions stored in its memory may tell its instruction processor when to transmit a RUNTIME signal to the other nodes via the B links telling them to start a test. Node ND15 may also store interrupt routines telling it how to respond to RUNTIME signals from other nodes which may, for example, signal errors or end of test. An incoming RUNTIME signal could tell node ND15 to read acquired test data out of an acquisition memory in one of the other nodes via, for example, link A and perform some action based on the value of the data. One such action could be to send an address to one or more other nodes via link A indicating the local memory location of a set of instructions to perform. This gives the tester the ability to automatically change the course of a test in response to values of acquired test data.

Figure 17:
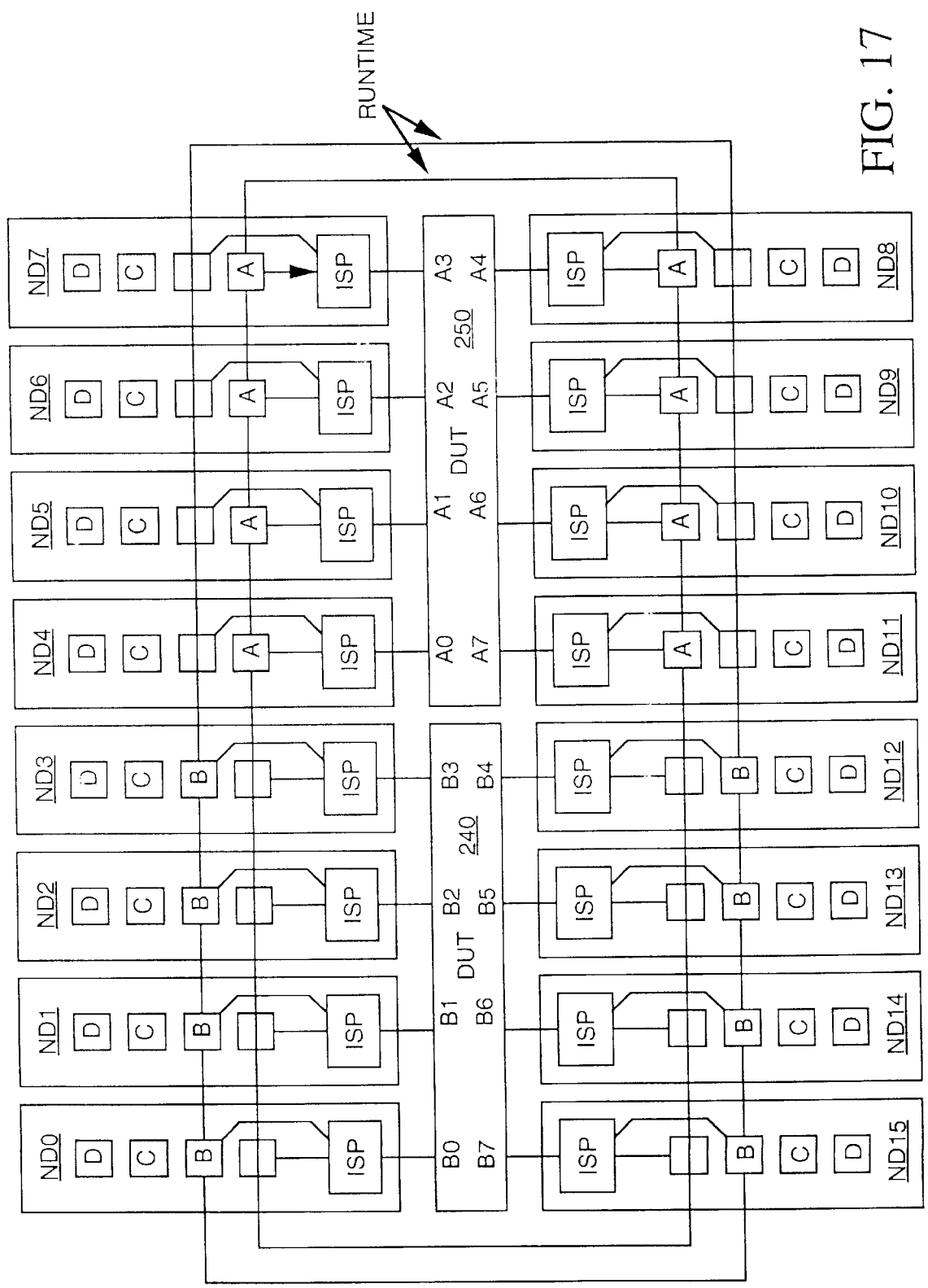

FIG. 17 is a block diagram illustrating a "multiple DUT" operating configuration for the integrated circuit tester of FIG. 1. In this configuration the tester can perform independent tests on more than one DUT. In the example of FIG. 17, two 8 pin DUT's 240 and 250 are being tested. Nodes ND0–ND3 and ND12–ND15 test pins B0–B7 of DUT 240 while nodes ND4–ND7 and 8–11 test pins A0–A7 of DUT 250. The A links of all nodes are interconnected in the manner illustrated in FIG. 12 to provide a RUNTIME signal path for the test of DUT 250 while the B links of all nodes are similarly interconnected to provide a RUNTIME signal path for the DUT 240 test. The two tests may be conducted in a completely independent manner with no RUNTIME signal coordination between the two tests. In this configuration the tester operates as two independent testers.

Tester Programming

To program the tester a user supplies a hardware description language (HDL) description of a test to the host computer. The HDL description is a sequence of data items of the form (TIME, ACTIONWORD,NODE). "NODE" indicates the particular node that is take an action. The size of NODE depends upon the number of nodes in the tester. In a 256 node tester, NODE is 8-bits. TIME indicates an elapsed time since the start of the test that the action is to be taken. When the test divided into $2^N$ test cycles and with each test cycle is resolved into $2^M$ time slots, TIME is an (M+N)-bit word.

"ACTIONWORD" is a 6-bit value indicating an action or actions to be taken by a node. The possible actions are drive high, drive low, compare high, compare low, tristate high and tristate low. ACTIONWORD is encoded as shown in TABLE I. For example, an ACTIONWORD value (100010) indicates that the tester is to drive the node output high and, at the same time, set its tristate buffer control high so that a high logic value test signal is sent to the pin device under test. Values for ACTIONWORD other than those shown in TABLE I are invalid.

TABLE I

| ACTIONWORD | DRIVE | COMPARE | TRISTATE |
| --- | --- | --- | --- |
| 100010 | HIGH | | HIGH |
| 010010 | LOW | | HIGH |
| 001001 | | HIGH | LOW |
| 000101 | | LOW | LOW |
| 000001 | | | LOW |

The host computer converts the HDL test description into a set of algorithms, one for each node, and stores the algorithms in the node memories. Each stored algorithm tells a node to generate a test vector of the form (TIMEWORD, ACTIONWORD), during each cycle of the test. As previously discussed, TIMEWORD indicates a particular time relative to the beginning of the test cycle that the action is to be taken. The 6-bit test vector ACTIONWORD is identical in meaning to the 6-bit HDL language ACTIONWORD. Note, however, that 20-bit TIMEWORD differs from the 10+N bit TIME of the HDL sequence. TIME indicates a total time from the beginning of the test that an action is to occur whereas TIMEWORD indicates only a relative time within a test period that the action is to occur. The 20-bit TIMEWORD is N bits smaller than the corresponding TIME value because it does not include a test cycle number. In a test involving, for example $2^{20}$ test cycles, TIME requires an additional 20 bits to indicate the test cycle. Each test vector is delivered to time formatter 38 of FIG. 2. Formatter 38 responds to a test vector by carrying out the indicated action at the indicated time in the manner described herein above.

Each algorithm produced by the host computer in response to the input HDL test description includes a sequence of 24-bit instructions which are stored in successive addresses of the node memory. Several types of such instructions as listed in TABLE II. Each of these instructions are discussed in detail below.

TABLE II

| TYPE | FORMAT |
| --- | --- |
| NOMAP | (0 ,TIMEWORD,ACTION) |
| ACTSEL | (100, A[0],...,A[20]) |
| NOTIME | (101, ACTION[0],...,ACTION [6]) |
| TIMESEL | (110,ACTION[0],TSEL[0]...ACTION[2],(TSEL[2]) |
| LOOP | (1110, STEP_NUM,LOOP_NUM) |
| FORWARD | (11110,NODE,CYCLES,PACKET_SIZE) |
| HALT | (11111,RUNTIME, x ... x) |

Figure 18:
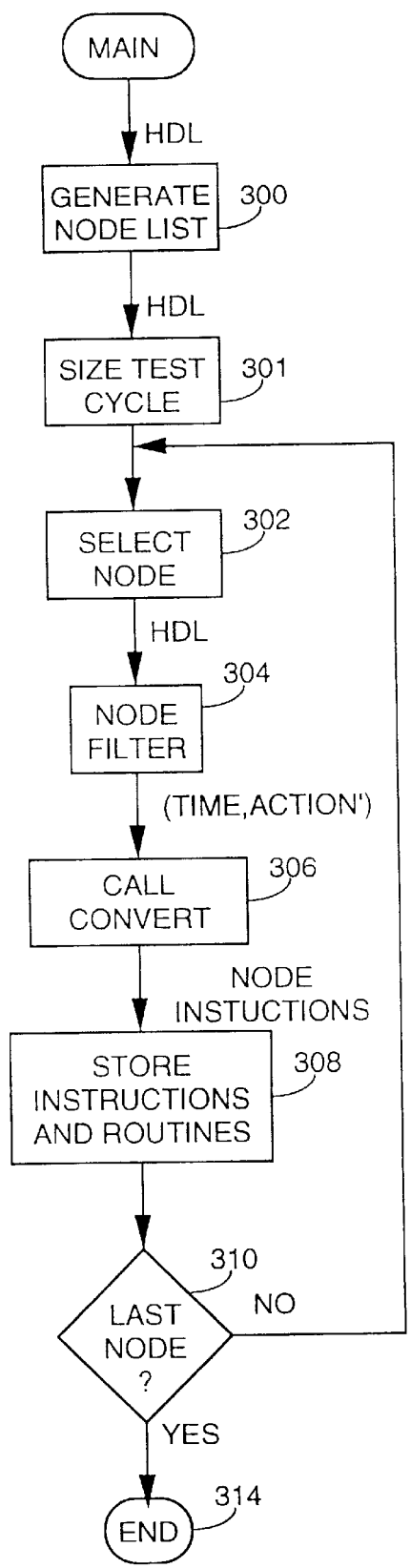

FIG. 18 is a data flow diagram illustrating the manner in which the host computer 22 of FIG. 1 converts the input HDL description of a test into the separate algorithms stored in the node memories. Starting at step 300, the host computer initially parses the input HDL code NODE value to determine which tester nodes are to be active during the test. At step 301, the host computer selects the period of test cycles to be used for the test by determining the shortest period between successive actions at any one node. The host computer does this by comparing HDL description TIME values for successive actions at the nodes.

At step 302 the host computer selects a first of the active nodes to be a "current node" and at step 302 it filters and modifies the HDL description to create a new data sequence that is specific to the current node. The HDL input to step 302 is a sequence of words of the form (TIME, ACTIONWORD,NODE). In step 302 the HDL sequence is stripped of words in which NODE does not refer to the current node selected in step 302. The NODE value is removed from the remaining HDL words. Thus the output of step 302 is a sequence of the form (TIME, ACTIONWORD) and conveys timing and action information for the current node only.

At step 306 the host computer calls a "convert" subroutine in which the output sequence of step 304 is converted into a set of instructions to be executed by the current node. At step 308 the host computer stores the instructions in the node's memory. It also stores in the node memory a set of subroutines which tell the node how to execute each instruction. (These subroutines are described in detail herein below.) If at step 310 the host computer determines that the current node is not the last node on its list of active nodes then, returning to step 302, the host computer selects a next node on the list to be current node and repeats steps 302 to 308 to produce an algorithm for the next node. The process continues until the host computer has generated and stored in the node memories a separate algorithm for every active node. At that point, the main routine ends (step 314).

Figure 19:
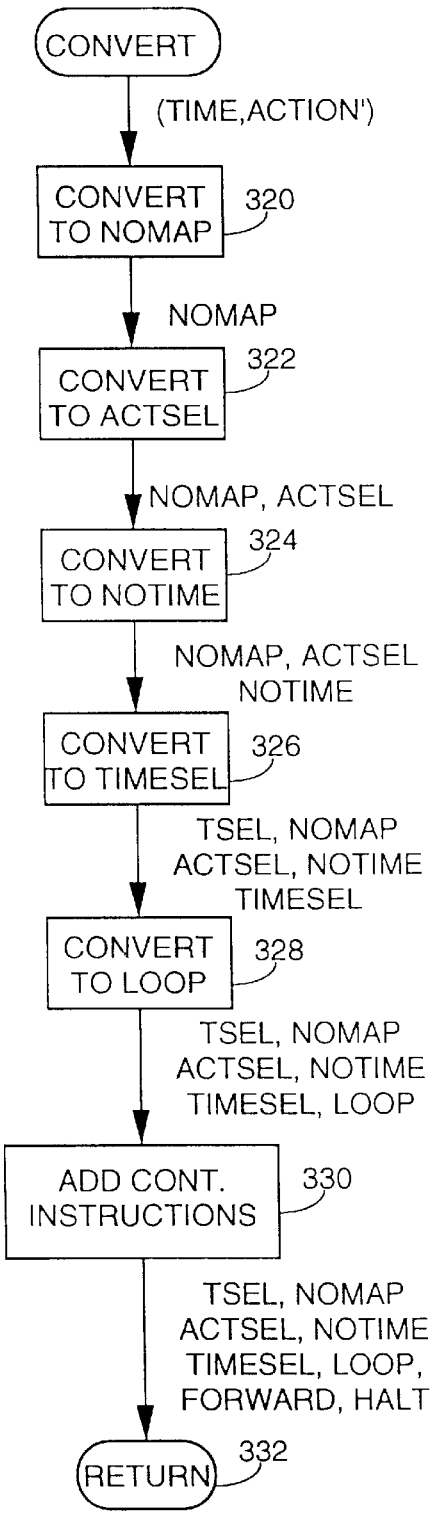

FIG. 19 is a data flow diagram illustrating the convert subroutine called at step 306 of FIG. 18. This subroutine converts the HDL description relative to a single node into a set of algorithmic instructions for that node. At beginning at step 320, the (TIME,ACTIONWORD) data items of the input HDL sequence are converted to NOMAP instructions of the form (0,TIMEWORD,ACTION). The most significant bit of the NOMAP instruction is a "0" which identifies the instruction as the NOMAP type. The next 20 bits (TIMEWORD) of the NOMAP instruction indicate a time slot within a test cycle to perform an action. The remaining 3 bits (ACTION) of the NOMAP instruction indicate the action to be taken. The 3-bit ACTION value is a compressed form of the 6-bit ACTIONWORD code of the HDL test description. TABLE III shows the conversions between ACTION and ACTIONWORD.

TABLE III

| ACTIONWORD | ACTION | DRIVE | COMPARE | TRISTATE |
|---|---|---|---|---|
| 100010 | 101 | HIGH | | HIGH |
| 001000 | 100 | LOW | | HIGH |
| 001001 | 011 | | HIGH | LOW |
| 000101 | 000 | | LOW | LOW |
| 000001 | 000 | | | LOW |

In the input sequence to step 320, each (TIME, ACTIONWORD) word indicates an action to be taken at a particular time. Since the HDL description does not organize the test into test cycles there is no correspondence between (TIME,ACTIONWORD) words and test cycles. However the host computer, at step 320 produces a sequence of NOMAP instructions, one for each test cycle, the test having been organized into test cycles of period being previously determined at step 301 of FIG. 18. When several test cycles occur between times represented by two successive input (TIME,ACTIONWORD) words, the host computer generates several similar NOMAP words, one for each test cycle. The position of each NOMAP instruction in the generated sequence indicates the test cycle for the action to be taken and its TIMEWORD value indicates the time during the cycle that the action is to be taken. Step 320 is the only conversion step in the convert routine where the output sequence is longer than the input sequence. The remaining conversion steps 322–328 progressively compress the step 320 output sequence.

After converting the HDL sequence into a sequence of 24-bit NOMAP instructions at step 320, the host computer compresses the sequence of NOMAP instructions, where possible, by converting contiguous groups of 21 NOMAP instructions into single 24-bit ACTSEL instructions (step 322). Thus a 24- bit ACTSEL instruction conveys the same information as 21 NOMAP instructions. The ACTSEL instruction format makes use of the fact that actions are often taken by a node at the same relative time during many successive cycles of a test. Thus the value of TIMEWORD may remain unchanged over many test cycles. Accordingly once the value of TIMEWORD is fixed by a NOMAP instruction, that TIMEWORD value may be used during successive cycles until it needs to be changed. Thus instructions following the NOMAP instruction that defines a TIMEWORD value need not themselves indicate timing unless timing changes from previous cycles. The ACTSEL instruction itself does not directly convey any timing information but inherently indicates that 21 successive actions are each to be taken at the same relative time during 21 successive test cycles, and that the relative time is indicated by the TIMEWORD provided by the last preceding NOMAP instruction.

The ACTSEL instruction format also makes use of the fact that at a given node actions are usually limited to two, rather than four choices. Referring back to TABLE III, a node may often be restricted to toggling between drive high and drive low (ACTION codes 101 and 100) or between compare high and compare low (ACTION codes 011 and 010) during successive cycles. Note that in toggling between drive high and drive low, or between compare high and compare low, only the last bit of the ACTION code changes.

An ACTSEL instruction is of the form (100, A[0], . . . , A[20]). The first 3 bits (101) identify it as an ACTSEL instruction and the remaining 21 bits A[0] . . . A[20] each indicate action to be taken during 21 successive test cycles. The remaining 21 bits A[0] . . . A[20] each represent only the last bit of an ACTION code. When a node executes the ACTSEL instruction it assumes that the first two bits of the ACTION code are the same as those conveyed by the last preceding NOMAP instruction.

Thus once an ACTION code and a TIMEWORD code are established by a NOMAP instruction, the host computer may replace sets of 21 successive NOMAP instructions with ACTSEL instructions, provided the TIMEWORD code remains unchanged and provided only the last bit of the ACTION code changes from NOMAP instruction to instruction. Since one 24-bit ACTSEL instruction replaces 21 NOMAP instructions, ACTSEL instructions provide 21/1 compression. The output sequence produced at step 322 for each node therefore consists of sets of ACTSEL instructions separated by one or more NOMAP instructions. The first instruction of the sequence is always a NOMAP instruction which establishes the current TIMEWORD and ACTION code. A NOMAP instruction appears in the sequence whenever the TIMEWORD changes or whenever either of the first two bits of the ACTION code changes.

When the first two bits of the ACTION code change frequently, the sequence produced by the host computer may still contain many NOMAP instructions which could not be replaced with ACTSEL instructions. At step 324, the host computer replaces groups of seven consecutive NOMAP instructions having similar TIMEWORD values with NOTIME instructions of the format (101,ACTION[0], . . . , ACTION[6]). The first three bits (101) identify the instruction as the NOTIME type. The remaining 21 bits consist of the seven ACTION codes, ACTION[0] . . . ACTION[6], of the seven successive NOMAP instructions the NOTIME instruction replaces. The TIMEWORD value for each cycle is assumed to be the value established by the last preceding NOMAP instruction. Since each NOTIME instruction replaces 7 NOMAP instructions, NOTIME instructions provide 7/1 compression.

When relative timing (TIMEWORD value) and either of the first two bits of the ACTION code change from cycle-to-cycle, the instruction sequence output of step 324 will still include numerous consecutive NOMAP instructions which could not be converted to the more compact ACTSEL or NOTIME instructions. However, though TIMEWORD may have any of $2^{20}$ different values, the number of different values TIMEWORD is actually assigned in a given test may often be limited to 16 or fewer. Even when TIMEWORD is not limited to 16 or fewer values, certain values of TIMEWORD often may occur with much greater frequency than others.

Thus at step 326, the host computer checks all of the remaining NOMAP instructions to determine the 16 most commonly occurring TIMEWORD values. It places these TIMEWORD as sixteen 20-bit "TSEL" TIMEWORDs words at the front of the instruction sequence. The host computer then replaces, where possible, groups of three consecutive NOMAP instructions with TIMESEL instructions of the form (110,ACTION[0],TSEL[0] ... ACTION [2],TSEL[2]). The first three bits (110) identify the instruction as the TIMESEL type. A set of three 3-bit values ACTION[0] ... ACTION[2] are action codes contained in the three consecutive NOMAP instructions being replaced by the TIMESEL instruction. A set of three 4-bit values TSEL[0] ... TSEL[2] reference ones of the sixteen stored TSEL words matching the TIMEWORDs included in the replaced NOMAP instructions. Since each TIMESEL instruction replaces three NOMAP instructions, TIMESEL instructions provide 3/1 compression.

The output sequence of step 326 may include repetitive sets of instructions. For example, the same ACTSEL instruction will occur many times in succession when a node does not change state over a large number of test cycles. Or the same pattern of NOTIME instructions may be repeated many times in succession when a node repeats the same pattern of actions over a large number of test cycles. To further compress the algorithm defined by the instruction sequence output of step 326, the host computer at step 328 now replaces all but the first occurrence of each repetitive instruction pattern with a LOOP instruction. A LOOP instruction is of the form (1110, STEP_NUM,LOOP_ NUM). The first four bits (1110) identify the instruction as a LOOP instruction. STEP_NUM is suitably a 10-bit quantity indicating the length of the pattern, up to 1024 instructions long. LOOP_NUM is suitably a 10-bit quantity indicating the number of successive occurrences of the pattern, up to 1024. Thus each LOOP instruction replaces up to $2^{20}$ other instructions. (STEM_NUM and LOOP_NUM may be other sizes).

Finally, at step 330, the host processor adds HALT and FORWARD instructions to the sequence. A HALT instruction is of the form (11111, RUNTIME, x ... x) where the first five bits identify the instruction as a HALT. The next bit (RUNTIME) tells the processor whether to transmit a runtime signal back to the host processor to signal the end of the test. The remaining bits of the HALT instruction are unused. The HALT instruction is placed at the end of the instruction sequence to indicate the end of the test. At step 332, the convert subroutine of FIG. 19 returns to step 308 of the main routine of FIG. 18.

A FORWARD instruction, of the form (11110,NODE, CYCLES,PACKET_SIZE) allows the system to make use of the memories within idle nodes to store additional instructions for active nodes. This is helpful when an instruction sequence for a node is longer than can be held in the node's memory. In such case portions of an instruction set may be stored in memories of idle nodes preceded by a FORWARD instruction. When a node encounters a FORWARD instruction it waits for a number of test cycles indicated by CYCLES and then forwards a set of instructions stored in a specified number of its node memory locations (indicated by PACKET_SIZE) to the node identified by NODE via the network bus. Those instructions are stored at sequential addresses in the receiving node's memory, overwriting instructions that have already been executed by the receiving node. The waiting time, indicated by CYCLES, is sufficient to ensure that the receiving node has already executed the instructions in the area of its node memory that is to receive the forwarded instructions. After the receiving node's processor reads the instruction stored at the last address of the node memory area reserved for instructions without having encountered a HALT instruction, it begins reading the newly received instructions at the first address of the instruction area of the node memory.

Figure 20:
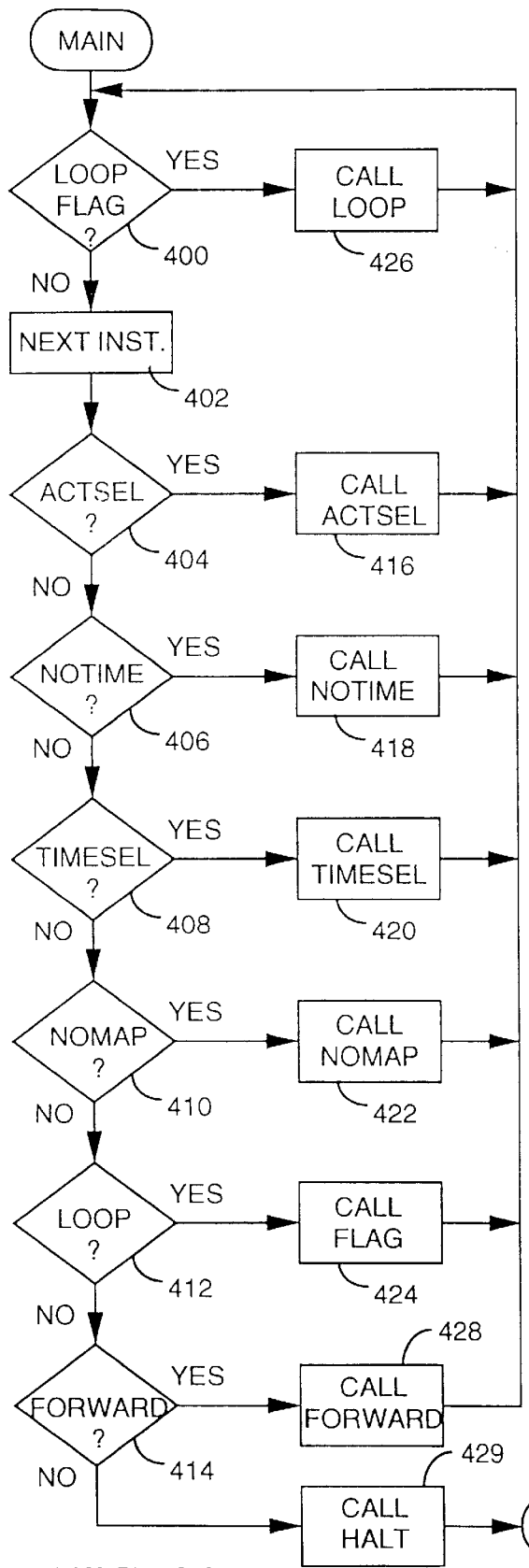

FIG. 20 illustrates a main routine executed by the instruction processor 36 of FIG. 2. The host computer stores the main routine and various subroutines in the node memories at step 308 of FIG. 18 when it stores the instruction sets in the node memories. The node processor begins executing its main routine (FIG. 20) at the start of a test in response to a START signal. The instruction processor make one pass through the main routine for each instruction. On each pass the instruction processor reads an instruction out of memory, determines the instruction type and executes the appropriate subroutine for that type of instruction.

Referring to FIG. 20 the main routine begins at step 400 where the instruction process checks to determine if it has previously set a "loop" flag. If the loop flag is not set, then the instruction processor is not in the process of executing a loop instruction. In such case, the instruction immediately reads a next instruction out of the next node memory address (step 402). (If the previous instruction was read out of the last address of the node memory area reserved for instructions, the processor at step 402 reads the next instruction from the first address of the instruction area. That instruction would have been forwarded to that memory address by another node in response to a FORWARD instruction.)

The processor then checks the identifying bits of the instruction to determine the nature of the instruction (steps 404–414) and calls the appropriate subroutine (steps 416–428) for generating the test vectors indicated by the instruction. Thereafter, the main routine returns to step 400 and repeats the process for the next instruction. If an instruction is a HALT instruction, (i.e. not an ACTSEL, NOTIME, TIMESEL, NOMAP, LOOP or FORWARD instruction) the main routine calls a HALT subroutine at step 429 and then ends at step 429.

Figure 21:
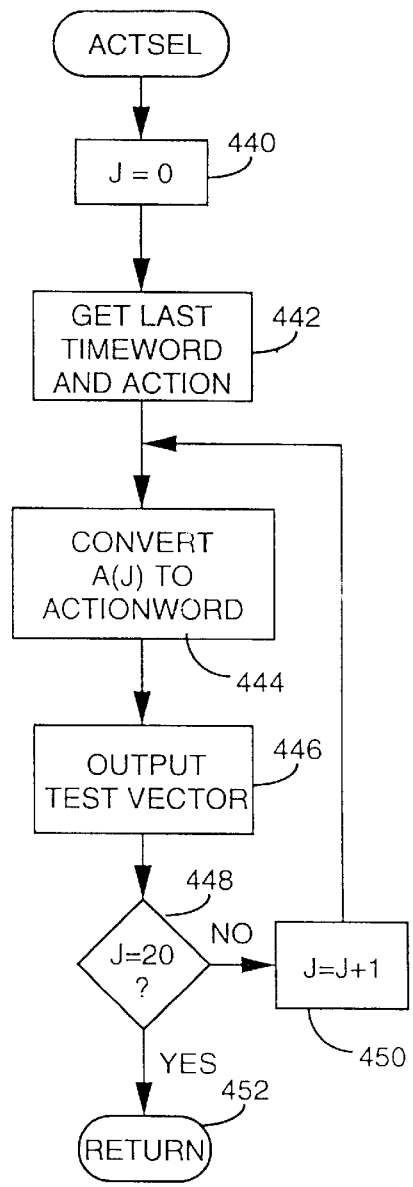

If at step 404 the node determines an instruction is an ACTSEL type, the ACTSEL subroutine of FIG. 21 is called. This routine causes the instruction processor to generate a sequence of 21 output test vectors of the form (TIMEWORD,ACTIONWORD) in response to the ACTSEL instruction. The data portion of the ACTSEL instruction is the form (A[0], ... , A[20]) where each bit A(n) represents the state of the least significant bit of an ACTION code from which the ACTIONWORD portion of one of the 21 test vectors is to be derived. Referring to FIG. 21, starting at step 440, a counter J is set to 0. J is used to keep track of the number of output test vectors. At step 442, the instruction processor retrieves from memory the values of TIME- WORD and ACTION for the last produced test vector. (As will be seen, the instruction processor stores these values in memory whenever they change). At step 444 the instruction processor converts bit A(J) into an appropriate ACTION- WORD by replacing the last bit of the retrieved ACTION code with A(J) and converting the result to an ACTION- WORD following the conversion pattern outlined in TABLE III. Then in response to a NEWCYCLE pulse from counter 184 of FIG. 10, the instruction processor (step 446) outputs a test vector using the TIMEWORD value read out of memory at step 442 and the ACTIONWORD value formed at step 444. If J is not yet 20, the value of J is incremented at step 450 and the process is repeated starting at step 444. When J reaches 20 at step 448, the instruction processor will have produced 21 output vectors and the subroutine returns to the main routine at step 452.

Figures 22, 23, 24:
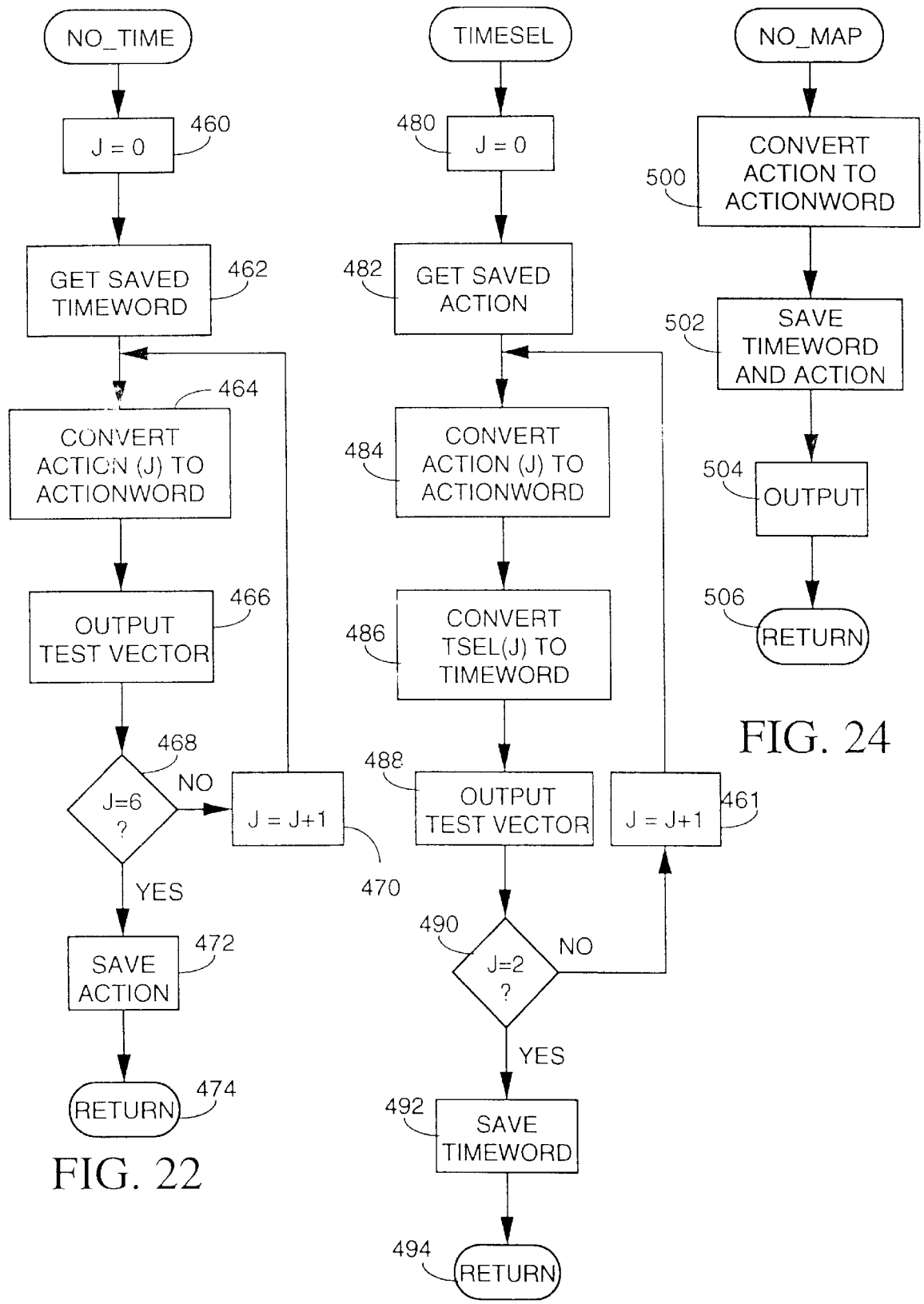

Referring again to the main routine of FIG. 20, if at step 406 the node determines the instruction is a NOTIME type, the NOTIME subroutine of FIG. 22 is called. This routine causes the instruction processor to generate a sequence of 7 output test vectors in response to the NOTIME instruction. The data portion of the ACTSEL instruction is the form (ACTION[0], . . . , ACTION[6]) where each 3-bit ACTION [n] code is to be converted into an ACTIONWORD portion of one of the 7test vectors to be produced. Referring to FIG. 22, starting at step 460, a counter J is set to 0. J keeps track of the number of output test vectors. At step 462, the instruction processor retrieves from memory the saved TIMEWORD for the last produced test vector, and at step 464 converts ACTION(J) to an ACTIONWORD following the conversion pattern outlined in TABLE III. Then in response to a NEWCYCLE pulse from counter 184 of FIG. 10, the instruction processor (step 466) outputs a test vector using the TIMEWORD value read out of memory at step 462 and the ACTIONWORD value formed at step 464. If J is not yet 6 (step 468), the value of J is incremented at step 470 and the process is repeated starting at step 464. When J reaches 6 at step 448, the instruction processor has produced all 7 output test vectors. Then at step 472, the instruction processor saves ACTION(J) as the store ACTION value corresponding to the last produced output corresponding to the At that point, and returns to the main routine at step 474.

If at step 408 of the main routine of FIG. 20, the node determines the instruction is a TIMESEL instruction, the TIMESEL subroutine of FIG. 23 is called. This routine causes the instruction processor to generate a sequence of 3 output test vectors in response to the TIMESEL instruction. The data portion of the TIMESEL instruction is the form (ACTION[0],TSEL[0] . . . ACTION[2],TSEL[2]). Referring to FIG. 23, starting at step 480, a counter J is set to 0. J keeps track of the number of output test vectors. At step 482, the instruction processor retrieves from memory the saved ACTIONWORD for the last produced test vector, and at step 484 converts ACTION(J) to an ACTIONWORD following the conversion pattern outlined in TABLE III. At step 486 it obtains from a memory location referenced by TSEL(J) a TIMEWORD to be used in the next output vector. In response to a NEWCYCLE pulse from counter 184 of FIG. 10, the instruction processor (step 488) outputs a test vector using the TIMEWORD value read out of memory at step 486 and the ACTIONWORD value formed at step 484. If J is not yet 2 at step 490, the value of J is incremented at step 491 and the process is repeated starting at step 484. When J reaches 2 at step 490, the instruction processor has produced all 3 output test vectors. The instruction processor then (step 492) saves the TIMEWORD of the last produces vector, and returns to the main routine (step 494.)

If at step 410 the node determines an instruction is a NOMAP instruction, the TIMESEL subroutine of FIG. 24 is called. This routine causes the instruction processor to generate one output test vector in response to the NOMAP instruction. The data portion of the NOMAP instruction is the form (TIMEWORD,ACTION). Referring to FIG. 24, starting at step 500, the instruction processor converts ACTION to an ACTIONWORD following the conversion pattern outlined in TABLE III. At step 502 the instruction processor saves the values of TIMEWORD and ACTION in memory and at step 504, in response to a NEWCYCLE pulse from counter 184 of FIG. 10, the instruction processor it 488 outputs a test vector using the TIMEWORD value contained in the NOMAP instruction and the ACTION-WORD value formed at step 500. The instruction processor then returns to the main routine (step 506.)

If at step 412 the node determines an instruction is a LOOP instruction, the FLAG subroutine of FIG. 25 is called. Referring to FIG. 24, starting at step 520, the instruction processor sets a LOOP_FLAG bit to indicate that it is currently processing a loop instruction. At steps 522 and 524 it saves in memory the values of STEP_NUM and LOOP_NUM contained in the loop instruction, at step 526 it initializes values of LOOP_CNT and STEP_CNT variables that it maintains in memory, and at step 528 it returns to the main program. STEP_NUM indicates the size of the sequence of instructions to be repeated and LOOP_NUM indicates the number of repetitions of that sequence of instructions. The LOOP_CNT variable keeps track of the number of repetitions of the sequence that have been executed and STEP_CNT keeps track of the position within the instruction sequence of the last instruction executed.

Referring to the main routine of FIG. 20, when the instruction process detects at step 400 that the loop flag has been set, it calls a LOOP routine at step 426. The loop routine tells the instruction process where to obtain the next instruction. Illustrated in FIG. 26, the loop routine begins at step 530 where the current value of STEP_CNT is compared to STEP_NUM to determine whether the last executed instruction was the last instruction of the instruction sequence being repeated. If not, the instruction processor increments the STEP_CNT value (step 532) and returns (at step 533) to step 402 of the main routine (FIG. 20) where it obtains the next instruction from memory.

The instruction processor maintains a record (an instruction count) of the memory location of the last obtained instruction (at step 402, FIG. 20) and obtains the next instruction from the next memory location. If at step 534 of FIG. 26, LOOP_CNT does not equal LOOP_NUM, then the processor at step 536 increments LOOP_CNT to indicate a new repetition of the instruction sequence is beginning and at step 538 resets STEP_CNT to 0 to indicate that the processor is about to obtain the first instruction of the sequence. At step 540, the instruction processor adjusts the instruction count maintained at step 402 (FIG. 20) of the main routine to determine the memory location of the next instruction. At step 540, FIG. 26, the count is set so that the first instruction of the repeated sequence is obtained.

Referring to FIG. 26, the processor continues to step through the repeated instruction set until at step 530 STEP_CNT is equal to STEP_NUM. At this point the instruction processor is about to execute the last instruction of the sequence to be repeated in response to the LOOP instruction. It then checks at step 534 to determine if it processing the last repetition of the sequence (i.e. when LOOP_CNT is equal to LOOP_NUM). In such case the instruction processor resets the LOOP_FLAG (step 542) to indicate that no loop instruction is being executed and returns to the main routine (step 402, FIG. 20) where the last instruction is retrieved from memory.

Referring to the main routine of FIG. 20, if at step 414 a FORWARD instruction is encountered, a FORWARD subroutine is called at step 428. The FORWARD subroutine is depicted in FIG. 27. The data portion of the FORWARD instruction is of the form (NODE,CYCLES,PACKET_SIZE) where NODE indicates the tester node to receive instructions, CYCLES indicates the number of test cycles to wait before sending the instructions, and PACKET_SIZE is the number of instructions to send to the receiving node. In step 550 the instruction count is adjusted to match ADDR and in step 552, the instruction processor waits for the indicated number of cycles. Then in step 552, the processor sends the instructions via the network bus to the receiving node.

Referring to the main routine of FIG. 20, if at step 414 a HALT instruction is encountered, then at step 429 a HALT subroutine is called. The HALT subroutine is depicted in FIG. 28. The data portion of the HALT instruction is of the form (RUNTIME, x . . . x). RUNTIME is a bit indicating whether the node is to send a RUNTIME signal to the host processor indicating end of test. If so then step 560 routes program flow to step 562 where the RUNTIME signal is sent to the host processor. If no RUNTIME signal is to be sent or following step 562, the HALT subroutine returns to the main routine (step 564). The main routine then ends (step 430, FIG. 20).

Thus it will be appreciated by those skilled in the art, that the multiple links 30 permit the tester to operate in a variety of useful configurations including those illustrated in FIGS. 15–17 as well as numerous combinations and permutations thereof.

Thus has been described and illustrated an integrated circuit tester for transmitting test signals to selected terminals of a device under test and acquiring data produced by the DUT at others of its terminals during a succession of test cycles. The tester includes several processing nodes, one node associated with each terminal of the DUT and each node includes a memory for storing algorithmic instructions for generating a sequence of commands. Each command includes action data indicating a particular action to be taken during a next test cycle and timing data indicating a time during the next test cycle when the action is to be taken. Each node also includes a circuits for processing the algorithmic instructions to produce the commands and circuits responsive to the commands for controlling the test signal and data acquisition as indicated by the commands. The integrated circuit tester can perform a long integrated circuit test without need for large node memories and without having to periodically halt the test to reload the node memories. The tester can also permit highly flexible and accurate timing of testing events during each cycle of a test. Since interconnection is node-to-node, signal transmission rate can be maximized, transmission lines can be optimized and node expansion is not limited by the laws of physics.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

I claim:

1. An apparatus for asserting test signals at controlled times, the apparatus comprising:

a plurality of nodes, each node executing a separate set of algorithmic instructions for generating commands indicating times and each node asserting a separate one of said test signals at the times indicated by the generated commands; and means for conveying a separate set of said algorithmic instructions to each of said plurality of nodes; wherein each of said plurality of nodes comprises:

memory means for storing said algorithmic instructions, processing means for executing said algorithmic instructions stored in said memory means thereby to generate said commands, and means for asserting said separate one of said test signals at said times indicated by said commands; and means connecting said plurality of nodes in series for delivering a start command to each of said plurality of nodes at a different time, wherein each of said plurality of nodes starts execution of said algorithmic instructions in response to said start command and wherein each of said plurality of nodes delays its response to said start command by a differing amount of time such that all of said plurality of nodes start execution of said algorithmic instructions at substantially the same time following receipt of said start command.

2. An apparatus for asserting test signals at controlled times, the apparatus comprising:

a plurality of nodes, each node executing a separate set of algorithmic instructions for generating commands indicating times and each node asserting a separate one of said test signals at the times indicated by the generated commands; and means for conveying a separate set of said algorithmic instructions to each said plurality of nodes; wherein each of said plurality of nodes comprises:

memory means for storing said algorithmic instructions, processing means for executing said algorithmic instructions stored in said memory means thereby to generate said commands, and means for asserting said separate one of said test signals at said times indicated by said commands; and means connecting said plurality of nodes in series for delivering a stop command to each of said plurality of nodes at a different time, wherein the processing means of each of said plurality of nodes stops execution of said algorithmic instructions in response to said stop command and wherein each of said plurality of nodes delays its response to said stop command by a differing amount of time such that all of said plurality of nodes stop execution of said algorithmic instructions at substantially the same time following receipt of said stop command.

3. An apparatus for asserting test signals at controlled times, the apparatus comprising:

a plurality of nodes, each node executing a separate set of algorithmic instructions for generating commands indicating times and each node asserting a separate one of said test signals at the times indicated by the generated commands; and means for conveying a separate set of said algorithmic instructions to each of said plurality of nodes; and wherein said means for conveying comprises a plurality of transmission lines interconnecting said nodes to form a network of nodes, each of said plurality of transmission lines interconnecting a pair of said nodes for conveying said algorithmic instructions therebetween.

4. An apparatus responsive to a fixed frequency reference clock signal for asserting output signals at times relative to said reference clock signal, the apparatus comprising:

a plurality of transmission lines for conveying algorithmic instructions; and a plurality of nodes, each node comprising:

means receiving said reference clock signal for executing algorithmic instructions for generating commands indicating times during periods indicated by said reference clock signal and for asserting a separate one of said output signals at times indicated by said commands;

a plurality of link means, each link means being connected to a separate pair of said transmission lines for receiving a set of algorithmic instructions conveyed on one transmission line of said pair of transmission lines and selectively one of transmitting the received set of algorithmic instructions on another transmission line of said pair of transmission lines or forwarding the received set of algorithmic instructions to said means for execution thereby, wherein said plurality of transmission lines interconnect said plurality of link means within each node to link means within others of said nodes to form a network wherein said plurality of transmission lines convey said algorithmic instructions between said nodes.

5. The apparatus in accordance with claim 4 wherein said means for executing comprises:

timing signal generator means responsive to said reference clock signal for generating a plurality of timing signals having said fixed frequency and being phase shifted one from another;

memory means for storing said algorithmic instructions;

processing means executing said algorithmic instructions stored in said memory means for generating said commands, and time formatting means responsive to said commands generated by said processing means and responsive to said plurality of timing signals for asserting said output signal in response to selected ones of said timing signals, said ones of said timing signals being selected in accordance with said timing data.

6. The apparatus in accordance with claim 5 wherein said timing signal generator means and said time formatting means are implemented on a common integrated circuit.

7. The apparatus in accordance with claim 4 wherein each of said nodes consists of a single integrated circuit.

8. An apparatus for generating test signals at predetermined times comprising:

a plurality of N−1 transmission lines, transmission lines 1 through N−1, for conveying algorithmic instructions, where N is an integer larger than 2;

a plurality of N nodes, nodes 0 through N−1, wherein each node generates a separate test signal, wherein each node I, for I=1 through N−1 is connected via transmission line I to node I−1 such that transmission line I conveys algorithmic instructions from node I−1 to node I, and wherein each one node I that is connected by transmission line I to a node I−1 and by a transmission line I+1 to a node I+1 comprises:

memory means for storing algorithmic instructions for generating timing data indicating times for asserting said test signal;

processing means for executing said algorithmic instructions stored by said memory means for generating said timing data and asserting said test signal at times indicated by the generated timing data; and transmission line interface means connected to transmission lines I and I+1 and to said memory means comprising means for receiving algorithmic instructions signals conveyed on transmission line I from node I−1 and selectively forwarding said algorithmic instructions to either said memory means or to node I−1 via transmission line I−1 .

9. The apparatus in accordance with claim 8 wherein said transmission lines also convey run time signals, wherein said algorithmic instructions stored in said memory means includes an instruction for generating a run time signal, wherein said processing means generates said run time signal when executing said instruction, and wherein said transmission line means further comprises means connected to transmission line I+1 and to said processing means for receiving said run time signal from said processing means and selectively transmitting said run time signal to node I+1 via transmission line I+1 .

10. The apparatus in accordance with claim 8 wherein said transmission lines also convey run time signals, and wherein said transmission line means further comprises routing means connected to transmission line I and to said processing means for routing a run time signal conveyed on transmission line I to said processing means, wherein said processing means responds to said run time signal by executing a particular portion of said algorithmic instructions stored in said memory means.

11. The apparatus in accordance with claim 10 wherein said routing means is also connected to transmission line I+1 and also routes said run time signal to node I+1 via transmission line I+1.

* * * * *

UNITED STATES PATENT AND TRADEMARK OFFICE
CERTIFICATE OF CORRECTION

PATENT NO. : 5,931,953
DATED : August 3, 1999
INVENTOR(S) : Gary J. Lesmeister

It is certified that error appears in the above-identified patent and that said Letters Patent is hereby corrected as shown below:

```
    Column 30, line 18 (claim 8, line 26), "I-1" should be
deleted and replaced with --I+1--.
    Column 30, line 19 (claim 8, line 27), "I-1" should be
deleted and replaced with --I+1--.
```

Signed and Sealed this

Seventh Day of December, 1999

Attest:

Q. TODD DICKINSON

Attesting Officer

Acting Commissioner of Patents and Trademarks